(12) United States Patent
Lee et al.

(10) Patent No.: US 11,264,310 B2
(45) Date of Patent: Mar. 1, 2022

(54) SPRING BAR LEADFRAME, METHOD AND PACKAGED ELECTRONIC DEVICE WITH ZERO DRAFT ANGLE

(71) Applicant: Texas Instruments Incorporated, Dallas, TX (US)

(72) Inventors: Lee Han Meng Eugene Lee, Melaka (MY); Anis Fauzi Bin Abdul Aziz, Kedah (MY); Sueann Wei Fen Lim, Melaka (MY); Jin Keong Lim, Kuala Lumpur (MY)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/892,527

(22) Filed: Jun. 4, 2020

(65) Prior Publication Data
US 2021/0384110 A1    Dec. 9, 2021

(51) Int. Cl.
| *H01L 23/495* | (2006.01) |
| *H01L 21/56* | (2006.01) |
| *H01L 21/78* | (2006.01) |
| *H01L 23/00* | (2006.01) |
| *H01L 21/48* | (2006.01) |
| *H01L 23/31* | (2006.01) |

(52) U.S. Cl.
CPC .... *H01L 23/49541* (2013.01); *H01L 21/4825* (2013.01); *H01L 21/4842* (2013.01); *H01L 21/561* (2013.01); *H01L 21/565* (2013.01); *H01L 21/78* (2013.01); *H01L 23/3121* (2013.01); *H01L 23/49513* (2013.01); *H01L 24/32* (2013.01); *H01L 24/83* (2013.01); *H01L 24/97* (2013.01); *H01L 24/48* (2013.01); *H01L 24/73* (2013.01); *H01L 2224/32245* (2013.01); *H01L 2224/48091* (2013.01); *H01L 2224/48106* (2013.01); *H01L 2224/48247* (2013.01); *H01L 2224/73265* (2013.01)

(58) Field of Classification Search
CPC ......... H01L 23/49541; H01L 23/49513; H01L 21/565; H01L 21/78; H01L 21/4842; H01L 21/4825; H01L 24/83; H01L 24/32; H01L 23/3121; H01L 21/561; H01L 24/97; H01L 2224/73265; H01L 2224/32245; H01L 2224/48106; H01L 2224/48247; H01L 24/48; H01L 24/73; H01L 2224/48091
USPC ......................................................... 257/676
See application file for complete search history.

(56) References Cited

U.S. PATENT DOCUMENTS

| 6,649,447 B1 * | 11/2003 | Chang | ................... H01L 21/565 257/667 |
| 7,763,958 B1 * | 7/2010 | Lim | ..................... H01L 23/3107 257/666 |

(Continued)

*Primary Examiner* — Vu A Vu
(74) *Attorney, Agent, or Firm* — Ronald O. Neerings; Charles A. Brill; Frank D. Cimino

(57) ABSTRACT

A method includes attaching semiconductor dies to die attach pads of first and second columns of the lead frame; enclosing the semiconductor dies of the respective columns in respective first and second package structures; trimming the lead frame to separate respective first and second lead portions of adjacent ones of the first and second columns of the lead frame; moving the first columns along a column direction relative to the second columns; and separating individual packaged electronic devices of the respective first and second columns from one another.

16 Claims, 22 Drawing Sheets

(56) References Cited

U.S. PATENT DOCUMENTS

| | | | |
|---|---|---|---|
| 7,884,469 B2 * | 2/2011 | Shi | H01L 24/40 257/720 |
| 9,324,640 B1 * | 4/2016 | Eugene Lee | H01L 24/37 |
| 9,741,643 B2 * | 8/2017 | Lee | H01L 23/49551 |
| 2013/0127029 A1 | 5/2013 | Lee et al. | |
| 2014/0191381 A1 | 7/2014 | Lee et al. | |
| 2015/0144389 A1 | 5/2015 | Lee et al. | |
| 2015/0214136 A1 | 7/2015 | Lee et al. | |
| 2016/0133617 A1 | 5/2016 | Eugene Lee et al. | |
| 2017/0213784 A1 | 7/2017 | Lee et al. | |
| 2017/0309595 A1 | 10/2017 | Eugene Lee et al. | |
| 2017/0345743 A1 | 11/2017 | Lee et al. | |
| 2018/0122724 A1 | 5/2018 | Lee et al. | |

* cited by examiner

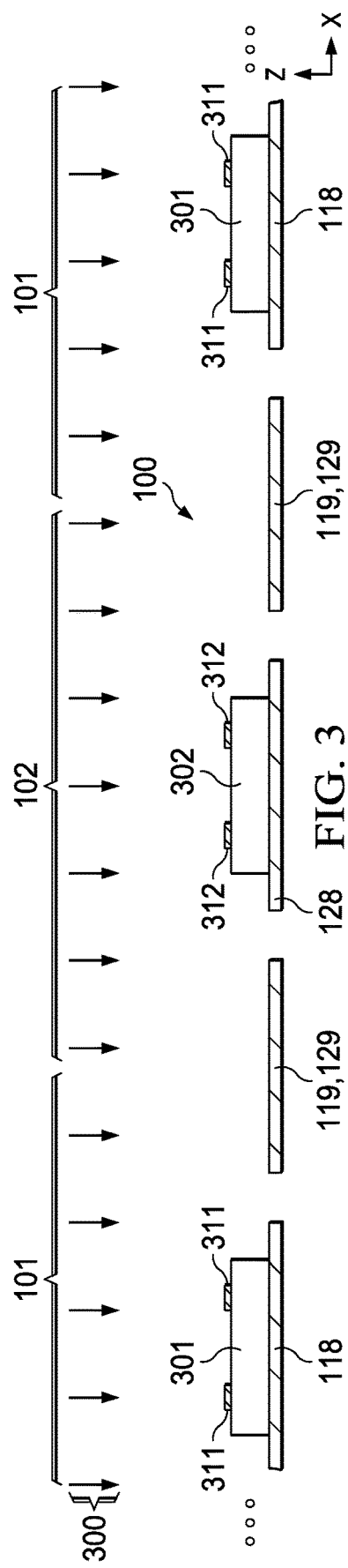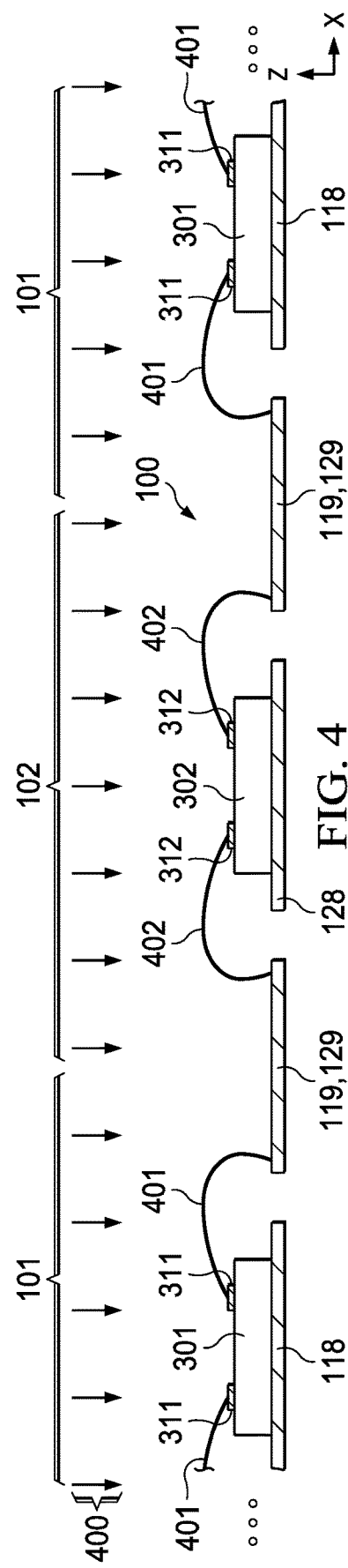

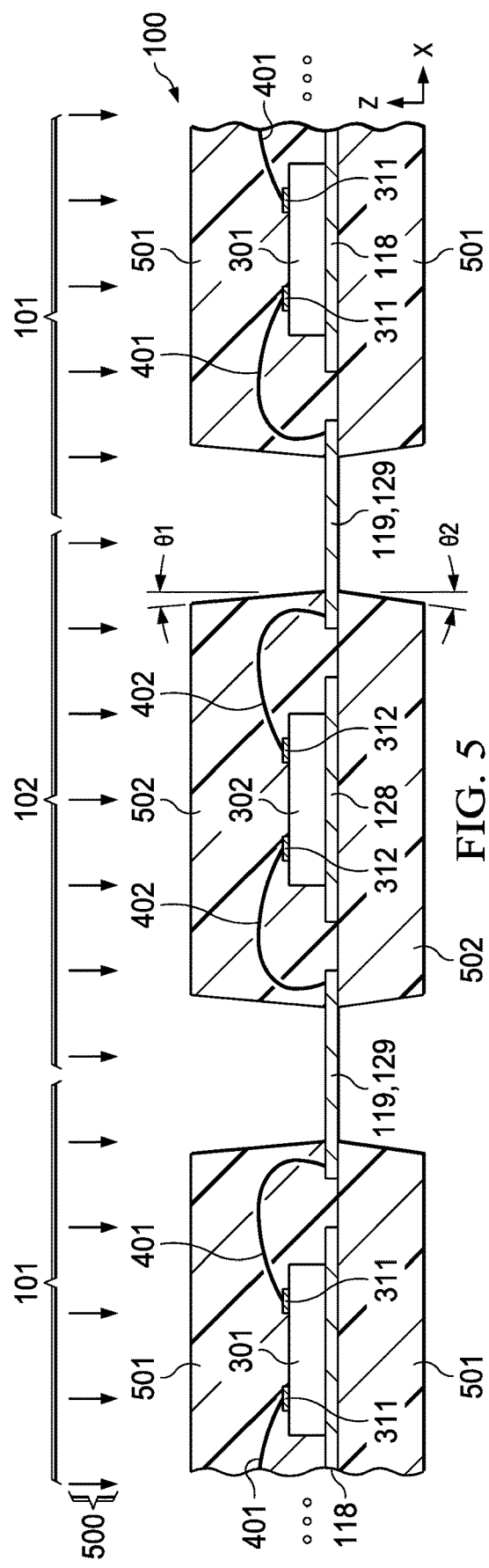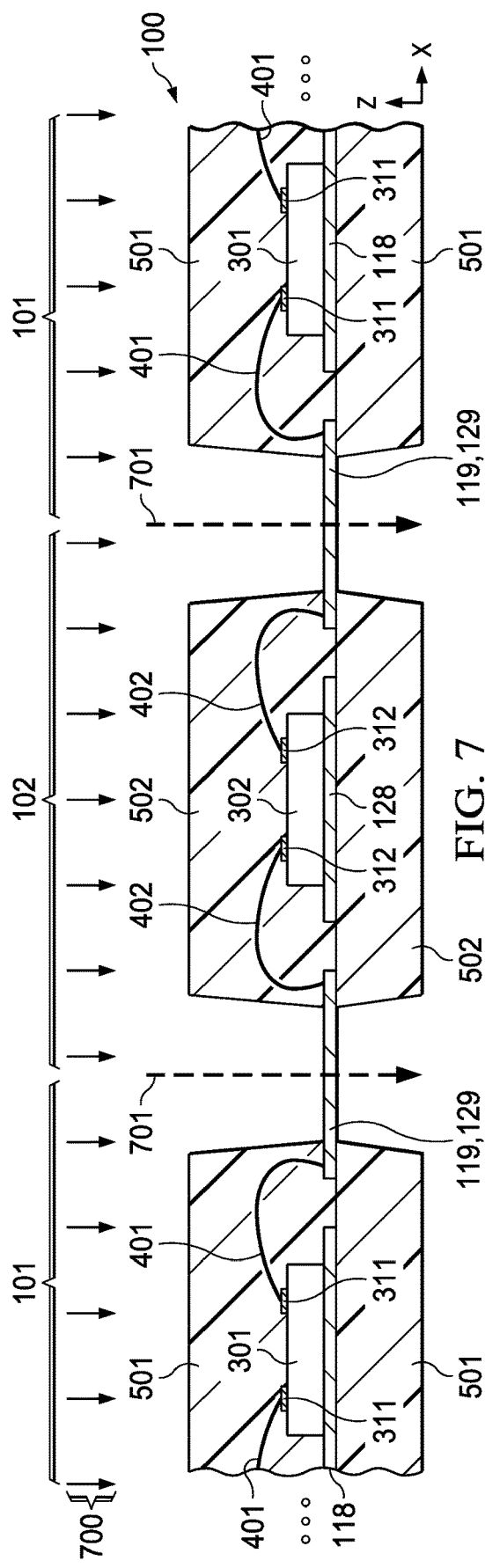

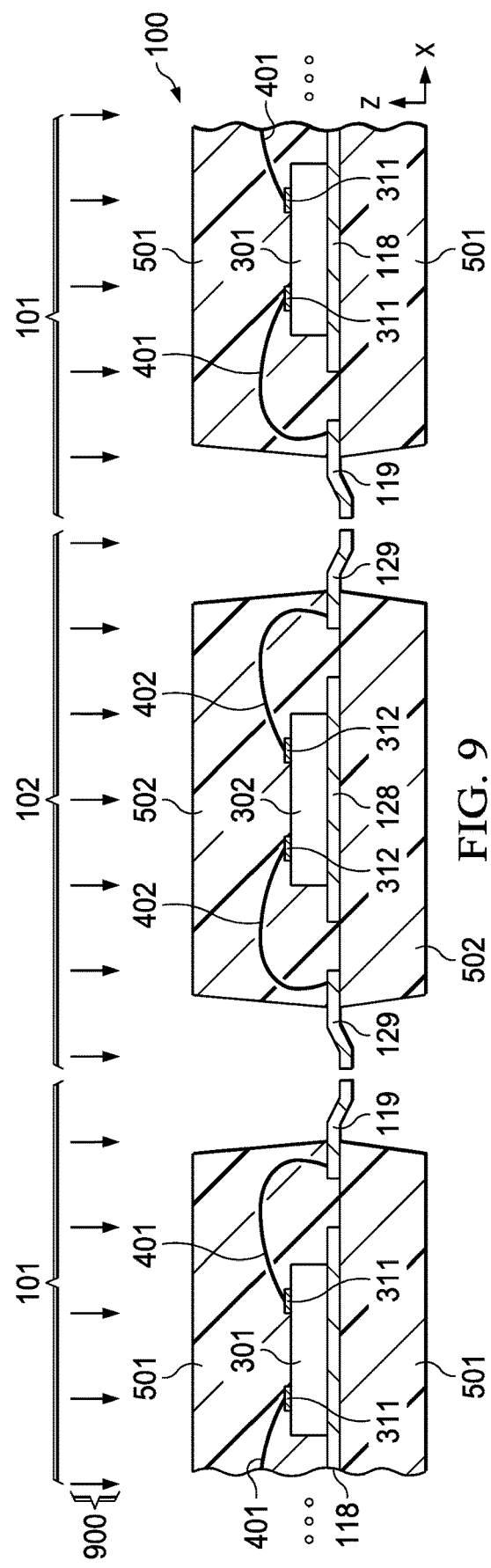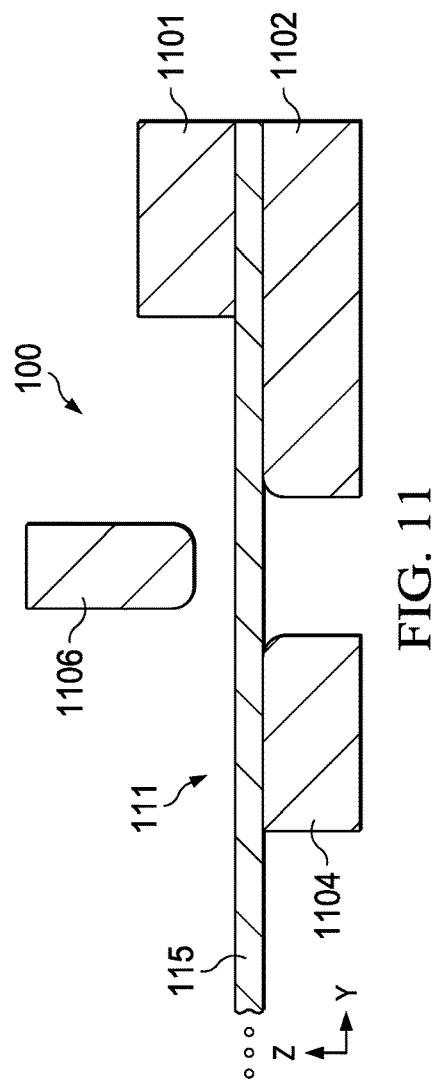

SPRING BAR LEADFRAME, METHOD AND PACKAGED ELECTRONIC DEVICE WITH ZERO DRAFT ANGLE

BACKGROUND

The cost of manufacturing electronic devices can be reduced by increasing the device count of a given lead frame panel (also referred to as a lead frame sheet or strip). Columns of devices of a lead frame sheet can be interdigitated to increase the device density, but interdigitated devices require trim and form dies to singulate or separate individual packaged devices from the lead frame. Trim and form dies are also used in electronic device manufacturing to cut and then form leads of individual devices while part of a lead frame strip having rows and columns of partially completed devices. However, multiple trim and form die sets are needed for different lead frame strip configurations in manufacturing a variety of different devices having different lead counts and configurations.

SUMMARY

A lead frame is provided according to one aspect. The lead frame includes a metal structure with prospective device portions arranged in rows and columns along respective first and second directions. The columns include first columns and second columns, where at least some of the first columns are adjacent to one of the second columns. The lead frame includes punch structures with a punch bar that extends along the second direction from a first end of a respective first column to a first clamp portion of the metal structure. The lead frame also includes stretch structures with a spring bar that extends from the second end of a respective first column to a second clamp portion of the metal structure.

In one example, the spring bar extends along an arcuate path. In one example, the respective punch structures include a second punch bar that extends along the second direction from the first end of the respective first column to the first clamp portion of the metal structure, and the respective stretch structures include a second spring bar that extends along a second arcuate path from the second end of the respective first column to the second clamp portion of the metal structure. In one example, the respective spring bar and the second spring bar include first and second arcuate portions.

In one implementation, the punch bar is deformable along a third direction normal to a plane of the first and second directions, and the spring bar is configured to extend along the second direction to allow movement of the respective first column along the second direction toward the first clamp portion of the metal structure.

In one example, the first columns have first device portions that include a respective first die attach pad and respective first lead portions, and the second columns have second device portions that include a respective second die attach pad and respective second lead portions. In one implementation, at least some of the first lead portions of a given one of the first columns are connected to a respective one of the second lead portions of a second device portion of an adjacent one of the second columns. In one example, the first columns and the second columns are alternating. In one example, the spring bar is configured to extend along the second direction toward the first clamp portion by a pitch spacing distance of the first lead portions in response to deformation of the punch bar by a punch depth dimension.

A method is provided according to another aspect. The method includes attaching first semiconductor dies to respective first die attach pads of first device portions of respective first columns of a lead frame, and attaching second semiconductor dies to respective second die attach pads of second device portions of respective second columns of the lead frame. The method further includes performing a molding process and separating individual packaged electronic devices of the respective first and second columns from one another. The molding process encloses the first semiconductor dies of each respective first columns in a single respective first package structure, and encloses the second semiconductor dies of each respective second column in a single respective second package structure.

In one example, the lead frame includes rows that extend along a first direction and the first and second columns extend along a perpendicular second direction, and the method further includes cutting through the lead frame and the first and second package structures along cut lines between the first device portions of the respective first columns and between the second device portions of the respective second columns, where the cut lines are parallel to the first direction.

In one example, moving the first columns along the second direction relative to the second columns includes deforming punch bars proximate first ends of the respective first columns along a third direction normal to a plane of the first and second directions to extend spring bars proximate second ends of the respective first columns along the second direction. In one implementation moving the first columns along the second direction includes moving the first columns by a pitch spacing distance of the first lead portions relative to the second columns.

In one example, before performing the molding process, the method further includes performing an electrical connection process that electrically couples at least one of the first lead portions to a conductive feature of the respective first semiconductor die, and electrically couples at least one of the second lead portions to a conductive feature of the respective second semiconductor die.

In one example, before separating the individual packaged electronic devices from one another, the method further includes performing a lead trimming process that cuts through the lead frame along trim lines to separate respective first and second lead portions of adjacent ones of the first and second columns of the lead frame, where the trim lines are parallel to the second direction, and moving the first columns along the second direction relative to the second columns.

An electronic device is provided according to another aspect. The electronic device includes a molded package structure having a first side, a second side spaced apart from the first side along a first direction, a first end, a second end spaced apart from the first end along a second direction, as well as a top and a bottom spaced apart from the top along a third direction, where the second direction is perpendicular to the first direction and the third direction is normal to a plane of the first and second directions. The electronic device also includes a semiconductor die enclosed by the molded package structure, first conductive leads along the first side, at least one of the first conductive leads being electrically coupled to the semiconductor die, and second conductive leads along the second side. At least one of the second conductive leads is electrically coupled to the semiconductor die, and the respective first and second ends are planar.

In one example, the respective first and second sides include a first portion that extends from the top to a mold parting line at a first angle to a plane of the second and third directions, and a second portion that extends from the bottom to the mold parting line at a second angle to the plane of the second and third directions.

BRIEF DESCRIPTION OF THE DRAWINGS

FIGS. 3-16 show the lead frame of FIG. 1 in a fabrication process to produce packaged electronic devices.

DETAILED DESCRIPTION

Figure 1:
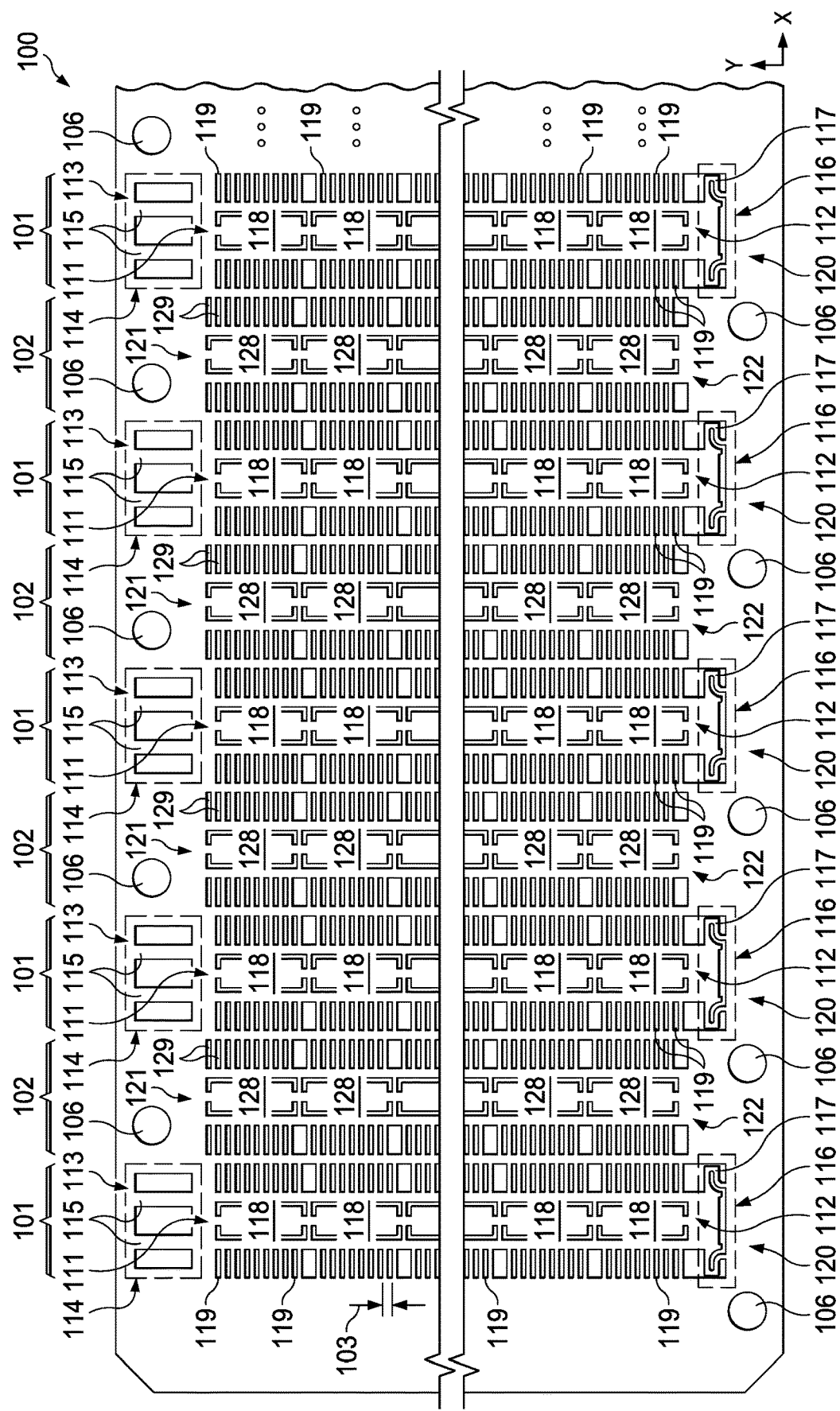
FIG. 1 is a partial top view of a lead frame with interdigitated columns, as well as punch structures and stretch structures at respective ends of the odd-numbered columns according to an embodiment.

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

FIG. 1 shows a partial top view of a lead frame 100 formed as a panel or strip with interdigitated first and second columns 101 and 102, respectively. The lead frame 100 includes a metal structure, such as copper, with prospective device portions arranged in rows along a first direction (e.g., the X direction in FIG. 1), as well as columns along a second direction (e.g., the Y direction in FIG. 1), where the first and second directions are perpendicular to one another. The lead frame is an interdigitated arrangement, in which respective device portions of the first columns 101 are offset or shifted along the second direction relative to the respective device portions of the second columns 102.

The lead frame 100 has punch structures and stretch structures at respective ends of the first columns 101 according to one aspect. These features facilitate using sawing or other cutting operations to trim device leads of the interdigitated columns, followed by molding and saw cutting to separate packaged devices, without requiring lead trim dies for lead trimming. The punch and stretch structures facilitate moving the first columns 101 along the column direction after lead trimming and molding to align the previously offset lead portions of the first and second columns 101 and 102. The lead frame 100 is an interdigitated configuration with device portions in each column 101 and 102 that include a respective die attach pad and lead portions with a pitch spacing distance 103. The device portions and respective lead portions in the first and second columns 101 and 102 are offset or shifted relative to one another by a single pitch spacing distance 103. In other examples, the offset is an integer number times the pitch spacing distance 103, where the integer number is 2 or more. In other examples, the interdigitated column offset is not an integer multiple of the pitch spacing distance 103. The lead frame 100 also includes several fixture alignment holes 106 to facilitate X, Y location of the lead frame 100 in a fixture or jig (not shown).

The respective first columns 101 have a first end 111 and a second end 112 spaced apart from the respective first end 111 along the second direction. The respective first columns 101 also include a punch structure 114 having a punch bar 115 that extends along the second direction from the first end 111 of a respective first column 101 to a first clamp portion 113 of the metal structure. The punch bar 115 is deformable along a third direction Z normal to a plane of the respective first and second directions X and Y (e.g., deformable into or out of the page in FIG. 1). The illustrated punch structures 114 include a second punch bar 115 extending along the second direction Y from the first end 111 of the respective first column 101 to the first clamp portion 113 of the metal structure. Other examples include an integer number of one or more punch bars 115.

The respective first columns 101 also include a stretch structure 116 that has a spring bar 117. The respective first columns 101 have first device portions that individually include a respective first die attach pad 118 and respective first lead portions 119. The spring bar 117 extends along an arcuate path from the second end 112 of a respective first column 101 to a second clamp portion 120 of the metal structure. The spring bar 117 is configured to extend along the second direction to allow movement of the respective first column 101 along the second direction Y toward the first clamp portion 113 of the metal structure. The spring bar 117 in the example of FIG. 1 is configured to extend along the second direction toward the first clamp portion 113 by the pitch spacing distance 103 of the first lead portions 119 in response to deformation of the punch bar 115 by a punch depth dimension, as described further below in connection with FIGS. 11-14. The illustrated stretch structures 116 include a second spring bar 117 extending along a second arcuate path from the second end 112 of the respective first column 101 to the second clamp portion 120 of the metal structure. Other examples include an integer number of one or more spring bars 117. In some examples, the respective spring bar 117 and the second spring bar 117 include first and second arcuate portions. In other examples, the spring bar or bars 117 include an integer number of one or more arcuate portions.

The respective second columns 102 have a first end 121 and a second end 122 that is spaced apart from the respective first end 121 along the second direction. The respective second columns 102 have second device portions that include a respective second die attach pad 128 and respective second lead portions 129. The lead frame 100 of FIG. 1 has alternating first columns 101 and second columns 102, in which at least some of the first columns 101 are adjacent to one of the second columns 102. In other examples, two or more second columns 102 can be adjacent to one another, with the individual first columns 101 adjacent to at least one of the second columns 102. In the example of FIG. 1, prior to lead trimming, at least some of the first lead portions 119 of a given one of the first columns 101 are connected to a respective one of the second lead portions 129 of a second device portion of an adjacent one of the second columns 102.

Figure 16:
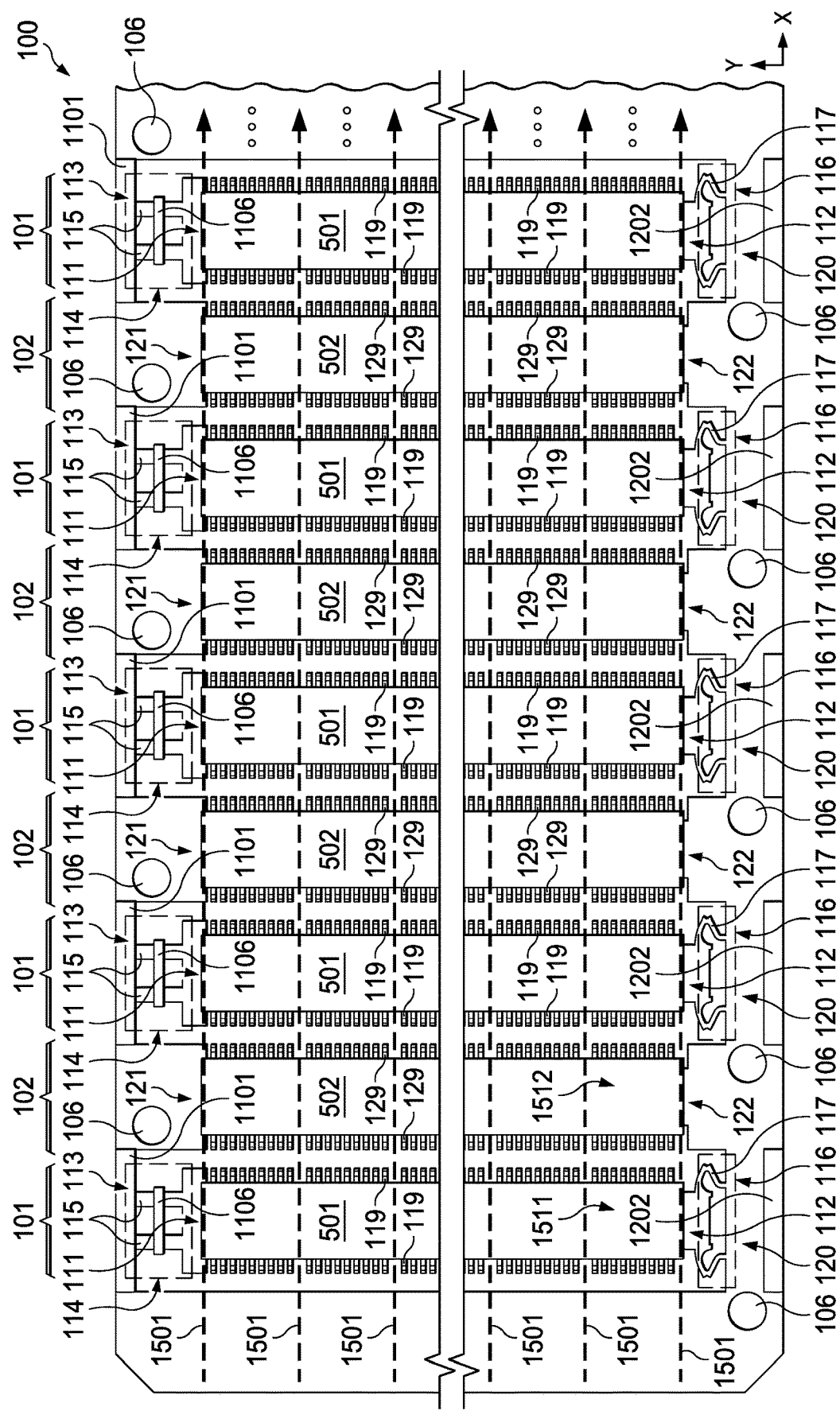
Figure 17:
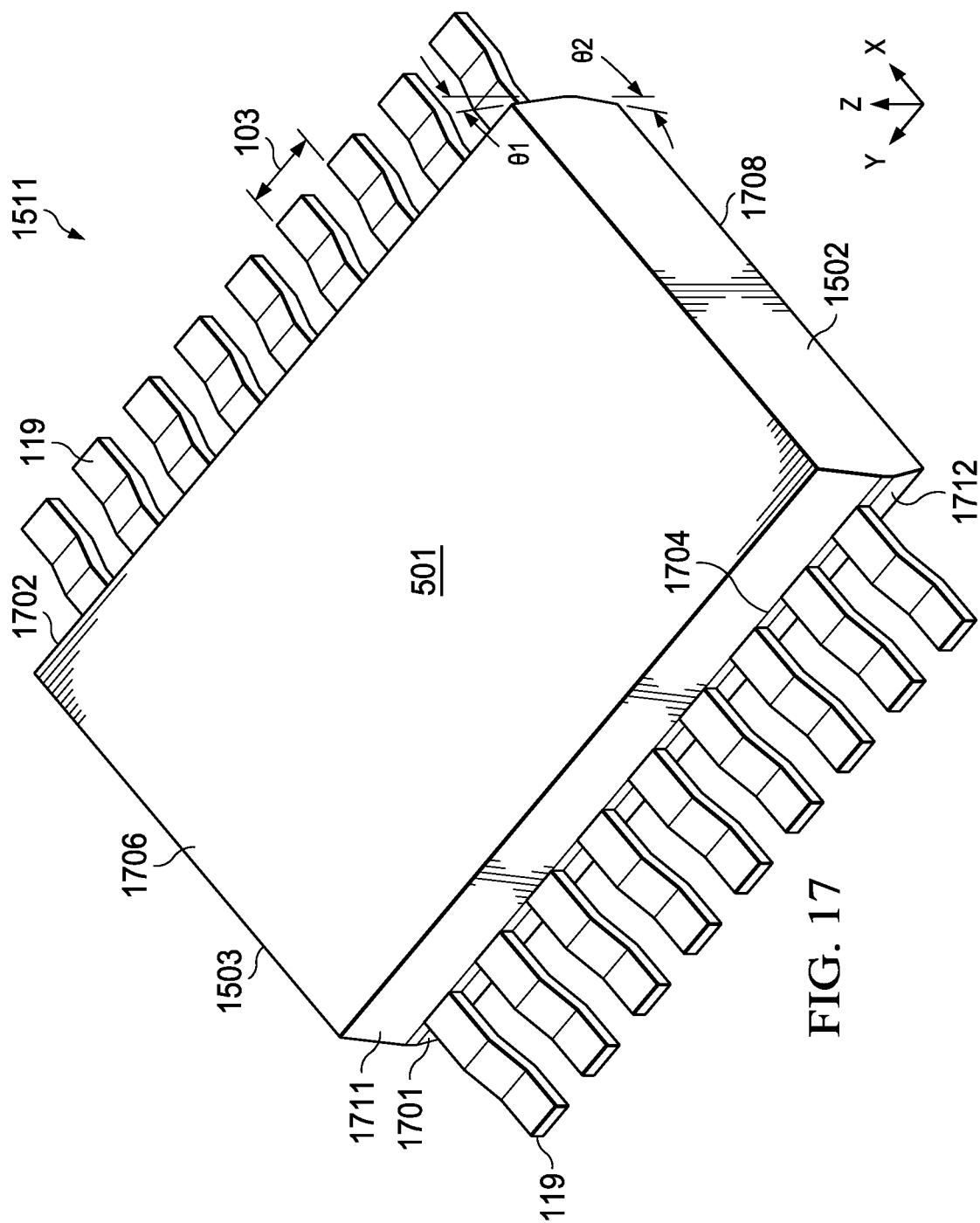
FIG. 17 is a perspective view of a packaged electronic device according to another embodiment.

Referring now to FIGS. 2-17, FIG. 2 shows a method 200 for fabricating packaged electronic devices, FIGS. 3-16 show the lead frame 100 of FIG. 1 undergoing processing according to the method 200, and FIG. 17 shows a packaged electronic device according to another embodiment. The method 200 includes providing or creating a lead frame (e.g., lead frame 100) at 202, attaching semiconductor dies to die attach pads of first and second columns of the lead frame at 204, electrical connection processing at 206, and enclosing the semiconductor dies of the columns 101 and 102 in respective first and second package structures at 208. The method 200 further includes trimming the lead frame 100 at 210 to separate respective first and second lead portions (e.g., 119 and 129) of adjacent ones of the first and second columns 101 and 102. The method 200 also includes lead forming at 212, moving the first columns at 214 along a column direction relative to the second columns, and package separation at 216 to separate individual packaged electronic devices of the respective first and second columns from one another and from the lead frame 100.

At 202 in one example, the starting lead frame 100 is provided or created at 202 as a metal structure formed as an interdigitated strip having rows and respective first and second columns 101 and 102, as well as respective punch structures and stretch structures 114 and 116 as shown in FIG. 1 above.

The method 200 includes performing a die attach process at 204. FIG. 3 shows one example in which a die attach process 300 is performed that attaches first semiconductor dies 301 to respective first die attach pads 118 of first device portions of respective first columns 101 of the lead frame 100. In this example, the first semiconductor dies 301 include conductive features, such as copper bond pads 311 on a top or upper side thereof. In addition, the die attach process 300 attaches second semiconductor dies 302 to respective second die attach pads 128 of second device portions of respective second columns 102 of the lead frame 100. The second semiconductor dies 302 in FIG. 3 include conductive features 312 on the top side thereof. One or both of the semiconductor dies 301 or 302 may include conductive features, such as solder bumps, copper pillars, etc. (not shown) that are electrically coupled to the respective die attach pads 118 and 128, for example, using a flip chip die attach process 300. In another example, the dies 301 and/or 302 are epoxied to the respective die attach pads 118 and 128 at 204.

The method 200 continues at 206 with wire bonding or other electrical connection processing. FIG. 4 shows one example, in which an electrical connection process 400 is performed, including wire bonding that electrically couples one or more of the first lead portions 119 to the respective conductive features 311 of the first semiconductor dies 301 of the first columns 101. The process 400 also electrically couples one or more of the second lead portions 129 to the respective conductive feature 312 of the second semiconductor dies 302 of the second columns 102. In one example, the electrical connection process 400 is performed while the lead portions 119 and 129 are connected to one another as shown in FIG. 4. The wire bonding process 400 connects first bond wires 401 between respective ones of the first lead portions 119 of the first columns 101 and respective conductive features 311 of the first semiconductor dies 301. In addition, the wire bonding process 400 in this example connects second bond wires 402 between respective ones of the second lead portions 129 in the second columns 102 and respective conductive features 312 of the second semiconductor dies 302.

Figure 6:
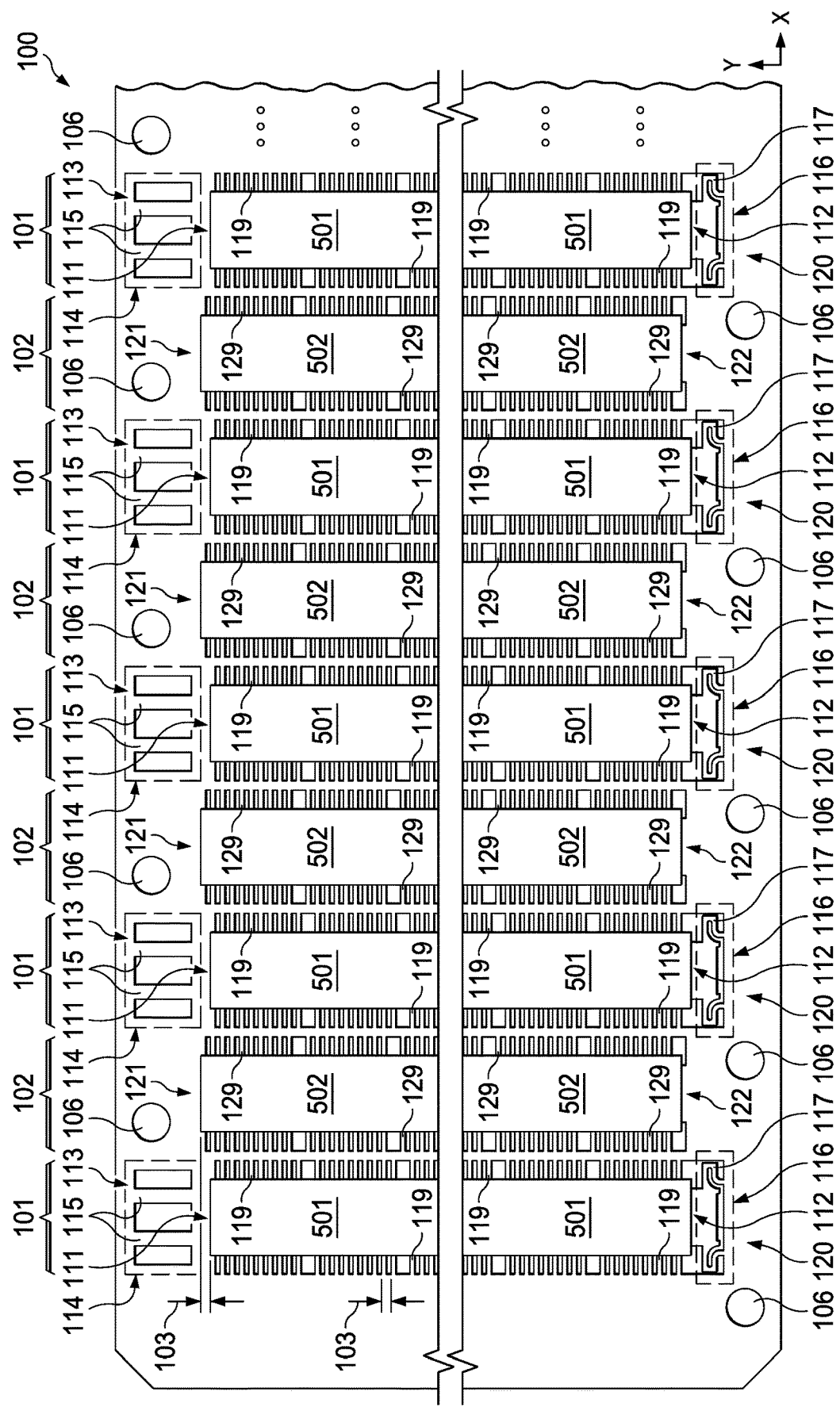

The method 200 continues at 208 with a molding process that creates single molded package structures along each of the first and second columns 101 and 102. FIGS. 5 and 6 show one example in which a molding process 500 is performed that encloses the first semiconductor dies 301 of each respective first columns 101 in a single respective first package structure 501. In addition, the molding process 500 encloses the second semiconductor dies 302 of each respective second column 102 in a single respective second package structure 502. The process 500 uses a mold (not shown) with a single mold cavity with upper and lower portions that create tapered sides joined at a mold parting line with an upper first draft angle θ1 and a lower second draft angle θ2 as shown in FIG. 5 to for each individual column 101 and 102. In one example, the cavities associated with the first columns 101 are offset from the cavities associated with the second columns 102 along the second direction (Y) by the lead pitch dimension, to create the offset molded package structures 501 and 502 as shown in FIG. 6, although not a strict requirement of all possible implementations.

Figure 8:
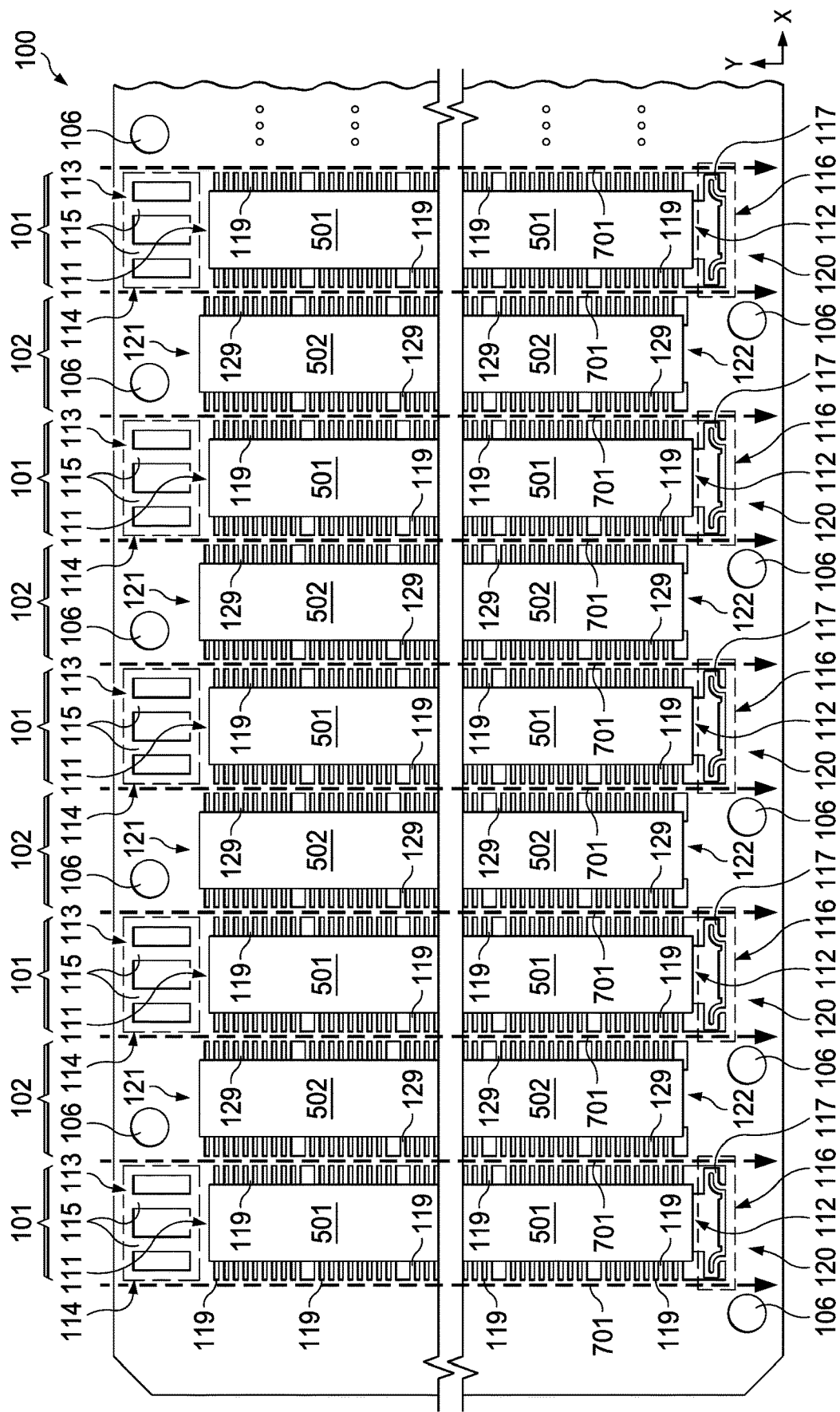

The method 200 continues at 210 with column direction lead trimming to separate the leads of adjacent columns. FIGS. 7 and 8 show one example, in which a lead trimming process 700 is performed that uses a saw to cut through the lead frame 100 along trim lines 701 between adjacent pairs of the first and second columns 101 and 102. The process 700 separates respective first and second lead portions 119 and 129 of adjacent ones of the first and second columns 101 and 102 which were previously joined in the starting lead frame 100 of FIG. 1. The process 700 in one example uses multiple cutting saw blades that cut along respective trim lines 701 concurrently. In another example, a single cutting blade is used to sequentially cut through designated portions of the lead frame 100 along the lines 701. Another example uses a laser to cut through the designated portions of the lead frame 100 along the trim lines 701. In the illustrated example, the trim lines 701 are parallel to one another and to the second direction, although not requirements of all possible implementations.

Figure 10:
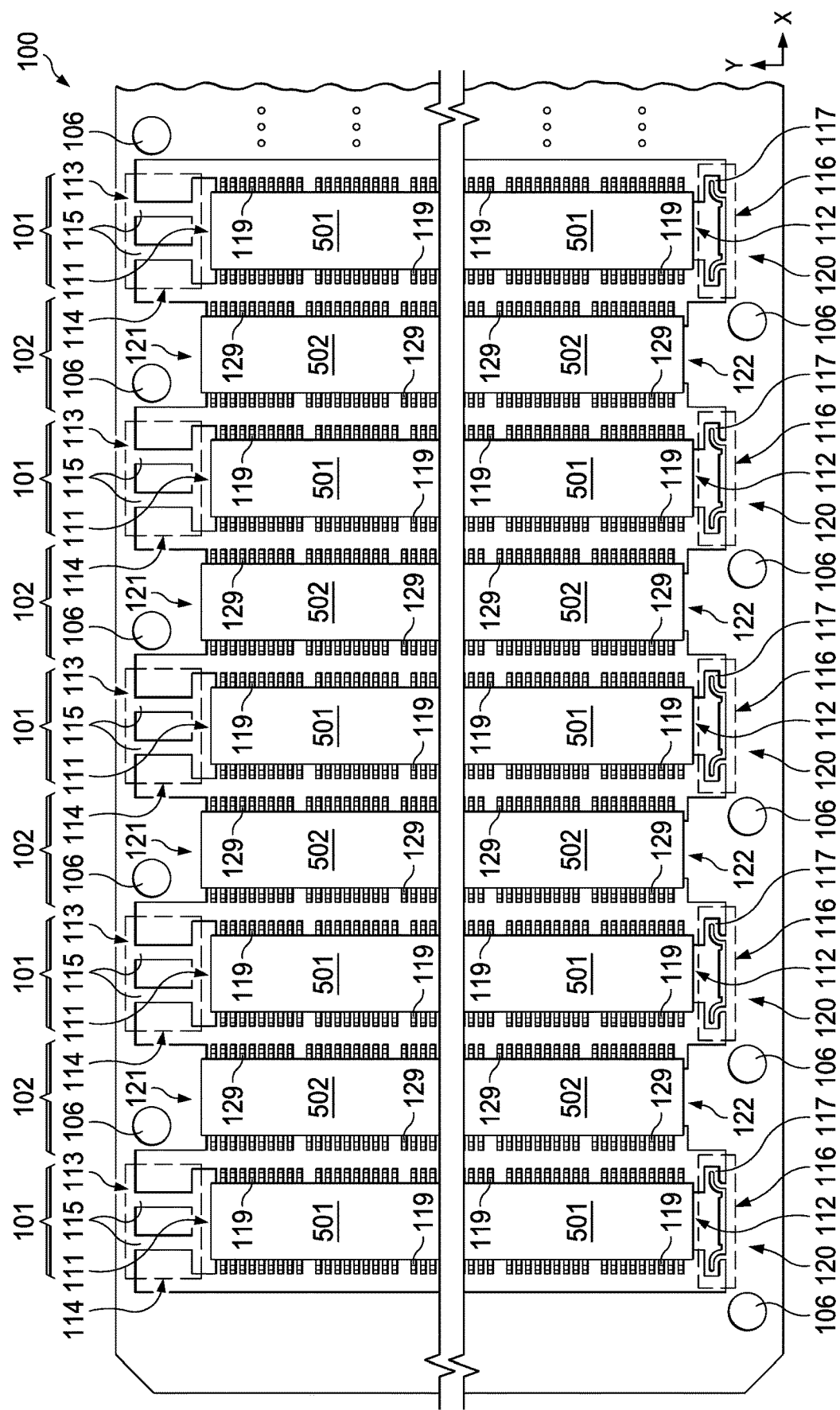

The method 200 continues at 212 with lead forming. FIGS. 9 and 10 show one example, in which a lead forming process 900 is performed that forms the first and second lead portions 119 and 129 of the respective first and second columns 101 and 102 into gull wing shapes. In other examples, the first and second lead portions 119 and 129 are formed into different shapes, such as J leads, etc.

Figure 12:
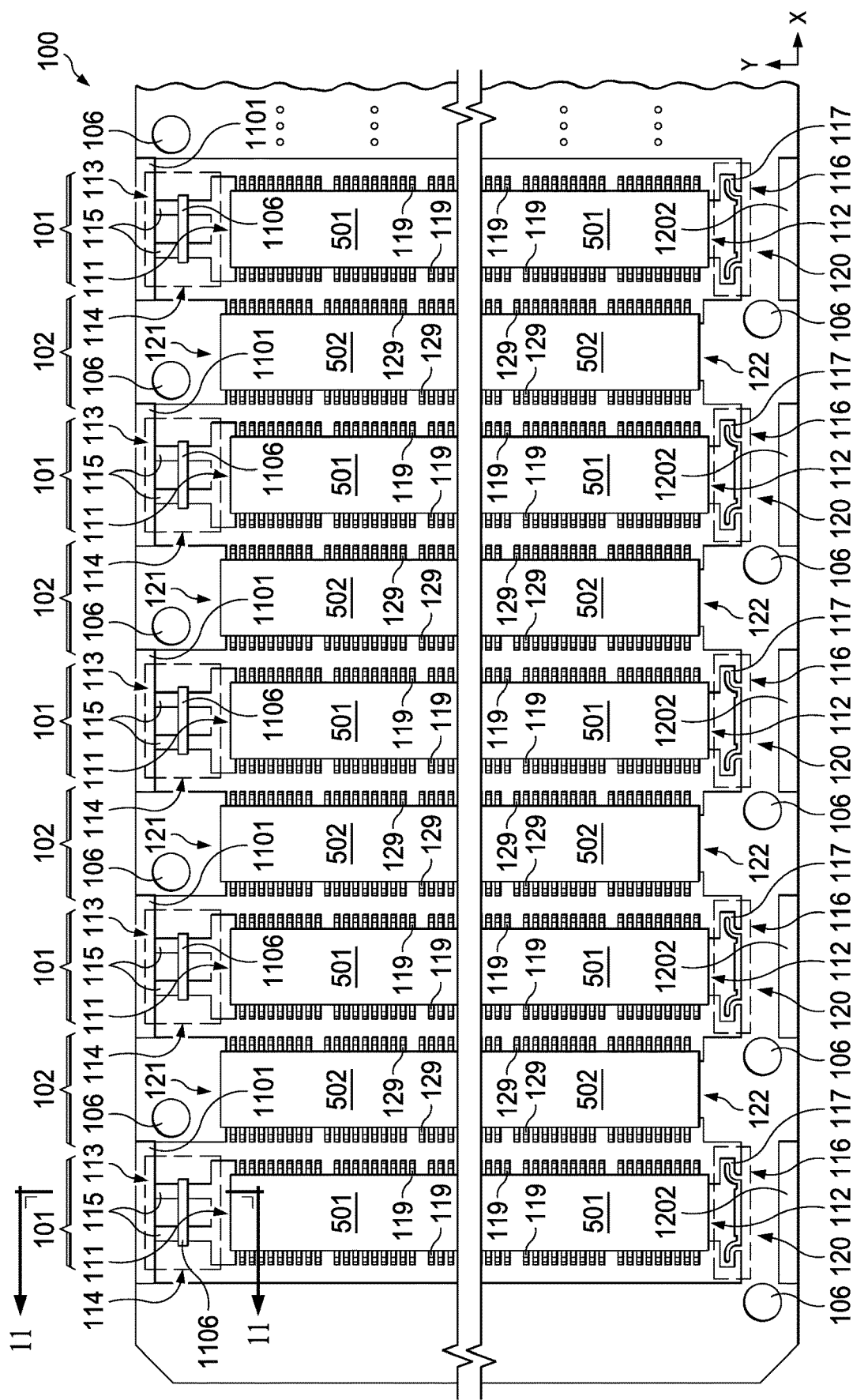

The method 200 continues at 214 with translating or moving the first columns 101 along the second direction relative to the second columns 102. FIGS. 11-14 illustrate one example, in which the first and second clamp portions 113 and 120 are clamped by clamping apparatus or other features of a fixture on which the lead frame 100 is installed (FIGS. 11 and 12), and a punch is actuated (FIGS. 13 and 14) along the third direction (e.g., the Z direction in FIGS. 11 and 13) to deform the punch bar 115. FIG. 11 shows a section view of a portion of the lead frame 100 proximate the first end 111 of one of the first columns 101 taken along line 11-11 of FIG. 12. A first clamp 1101 engages a top side of the upper edge of the lead frame 100 as shown in FIGS. 11 and 12, and a lower clamp 1102 engages the bottom side of the lead frame 100 to hold the edge of the lead frame 100 stationary as shown in FIG. 11. A lower die 1104 (FIG. 11) engages a bottom portion of a section of the punch bar 115, leaving a gap between the lower die 1104 and the lower clamp 1102. A punch 1106 is positioned in FIG. 11 above the top side of the punch bar 115 in a position over the gap between the lower die 1104 and the lower clamp 1102. As further shown in FIG. 12, a second clamp 1202 engages a top side of the bottom edge of the lead frame 100. Similar clamping and punch die features are provided at the ends of each of the individual first columns 101 as shown in FIG. 12.

Figure 13:
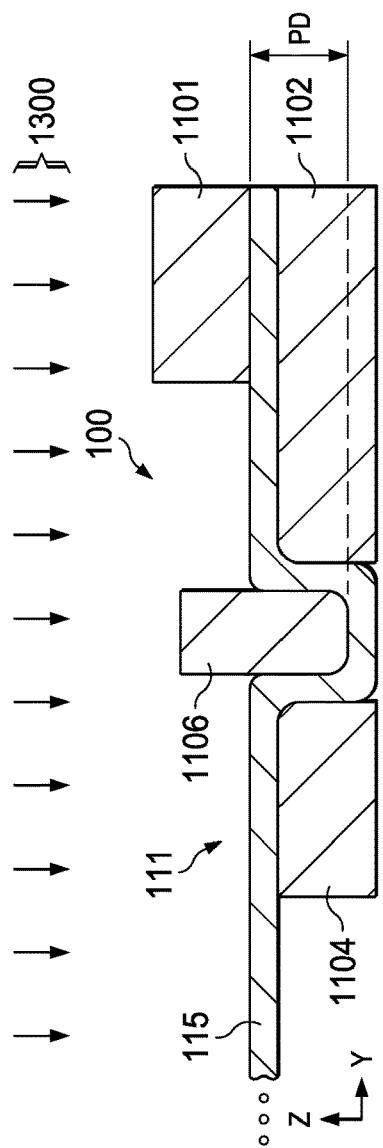
Figure 14:
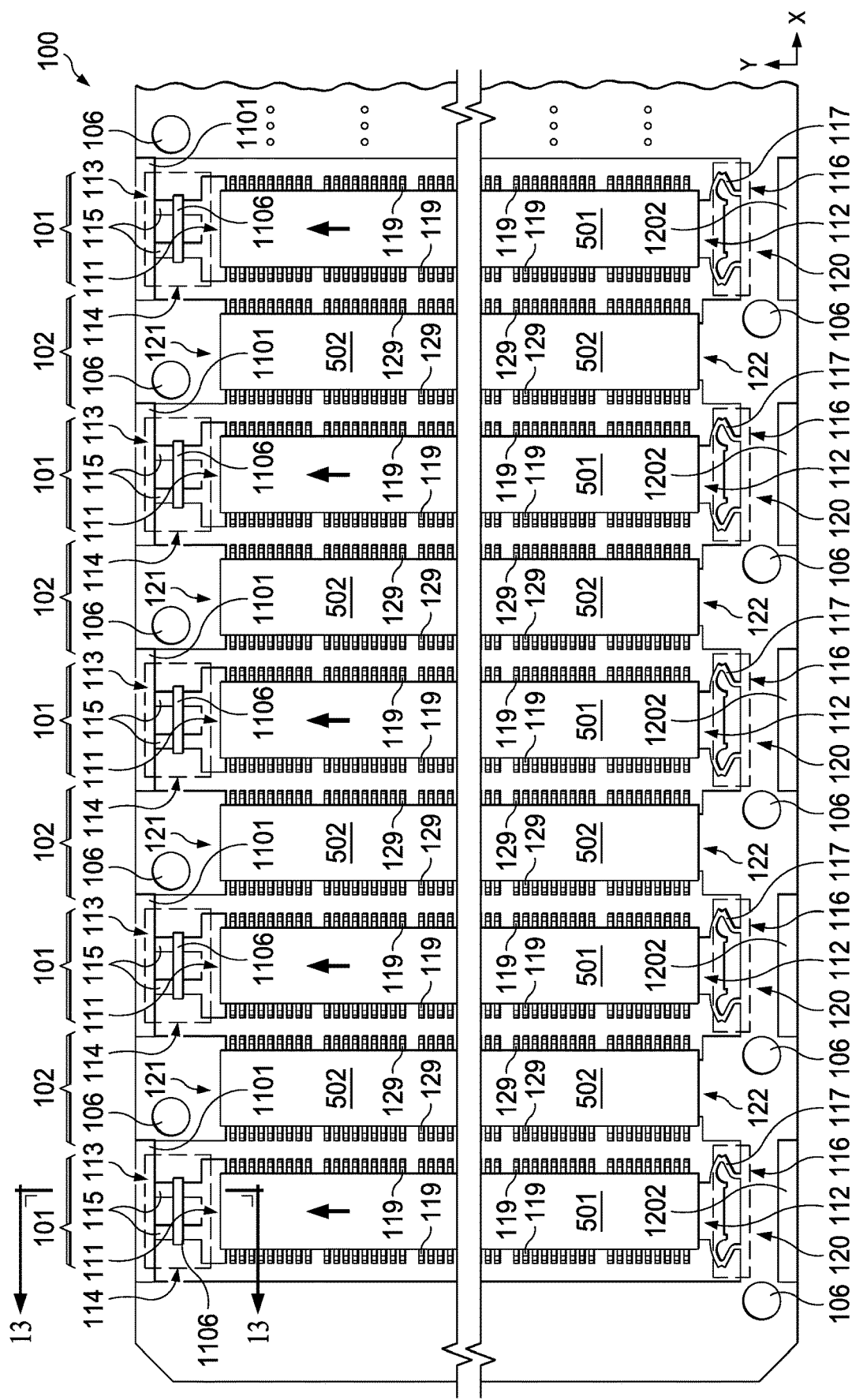

FIGS. 13 and 14 show an example, in which a punch process 1300 is performed that moves the punch 1106 downward (e.g., along the third direction "Z" in FIG. 13) normal to the X-Y plane of the respective first and second directions to deform the punch bars 115 proximate first ends 111 of the respective first columns 101. The Z direction deformation of the punch bars 115 by a punch depth dimension PD (FIG. 13) moves the first columns 101 along the second direction relative to the second columns 102 by the pitch spacing distance 103 of the first lead portions 119 (e.g., upward along the direction of the arrows in FIG. 14).

The movement of the first columns 101 along the second direction extends the spring bars 117 of the first columns 101 along the second direction as shown in FIG. 14. In one example, the punch 1106 is translated along the Z direction by an automated servo system (not shown). In another example, the punch 1106 is manually actuated. In one example, the punch depth dimension PD and the resulting Z direction movement of the punch 1106 are tailored according to the pitch spacing distance 103 or any other desired amount of Y direction movement of the first columns 101 relative to the second columns 102, as well as according to the thickness and material of the lead frame 100.

Figure 15:
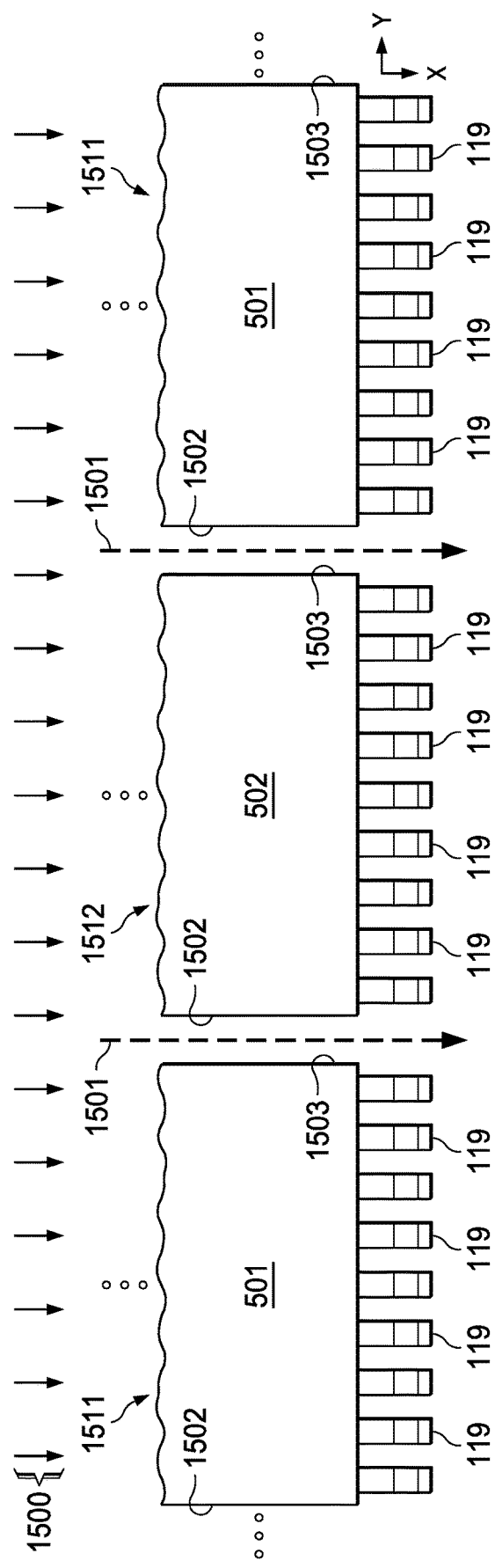

The method 200 continues at 216 with row direction cutting to separate the individual packaged electronic devices. The cutting at 216 also creates molded package and with a zero draft angle. FIGS. 15 and 16 show one example, in which a sawing process 1500 is performed along cut lines 1501 to separate individual device portions of the column-length molded structures, and to create first and second ends 1502 and 1503, respectively, for individual packaged electronic devices 1511 and 1512 of the respective first and second columns 101 and 102. The sawing process 1500 separates individual packaged electronic devices 1511, 1512 of the respective first and second columns 101 and 102 from one another. In another example, the packaged electronic devices 1511 and 1512 are separated from one another and from the lead frame 100 using a different cutting technique, such as laser cutting. Because the columns 101 and 102 were previously aligned by the punch operation at 214, the cut lines 1501 extend between the first device portions of the respective first columns 101 and between the second device portions of the respective second columns 102. In this example, the cut lines 1501 are parallel to the first direction, although not a requirement of all possible implementations.

The method 200 and the inclusion of the punch structures 114 and stretch structures 116 facilitate improved lead frame strip device density through interdigitated starting lead frame configurations (e.g., lead frame 100), while allowing cutting operations for lead trimming as well as device separation, and without requiring multiple trim and form die sets to accommodate multiple lead count and package sizes during integrated circuit manufacturing. The package saw cutting at 216 can be easily adapted to different lead frame configurations by changing a saw equipment recipe or programming, without requiring multiple tooling sets (e.g., punch die sets) to accommodate multiple lead counts. In one example, a jig (not shown) is used for manual pressing of the punch 1106 such that the Y direction translation of the first columns 101 provides accurate and repeatable pitch correction according to the punch depth PD, where the jig includes a handle, a hinge punch stopper, a track, and a jig base (not shown). The spring bar 117 in the example of FIG. 1 is configured to extend along the second direction toward the first clamp portion 113 by the pitch spacing distance 103 of the first lead portions 119 in response to deformation of the punch bar 115 by the punch depth dimension PD as shown in FIGS. 13 and 14.

Figure 2:
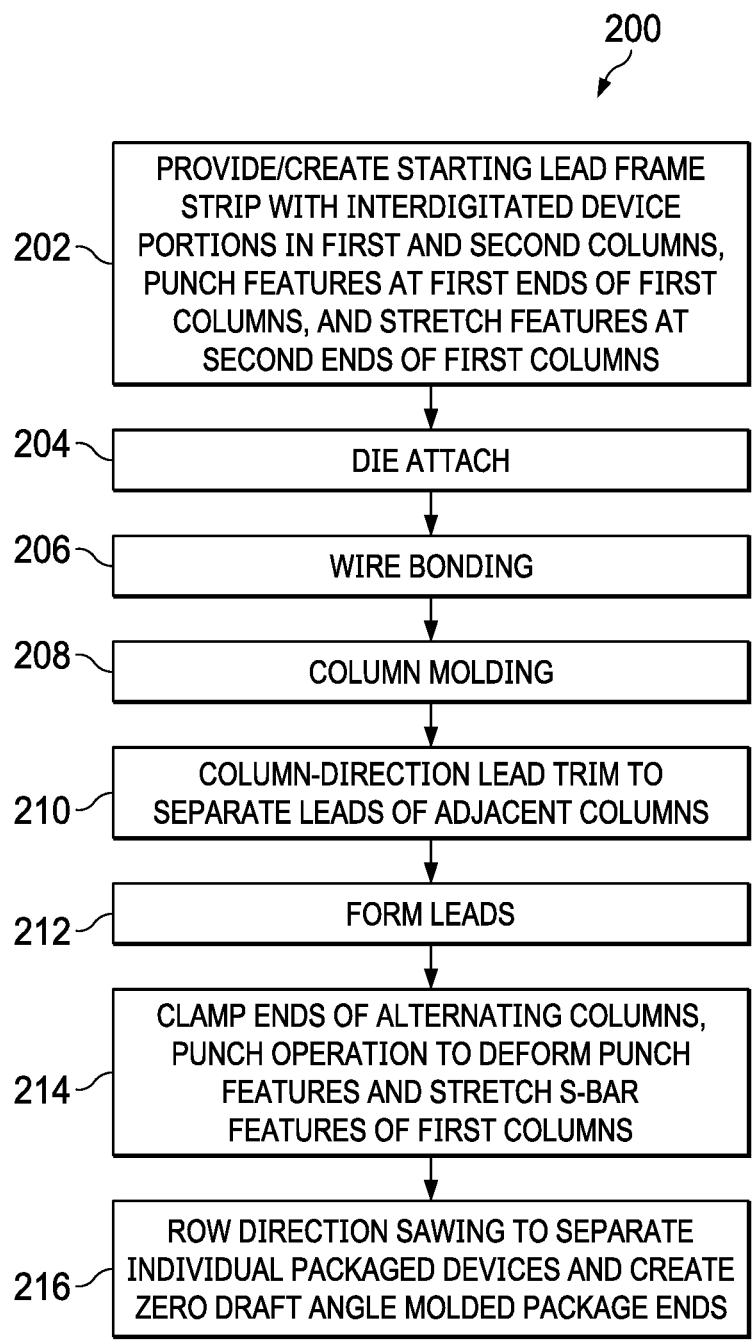
FIG. 2 is a flow diagram of a method according to another embodiment.

FIG. 17 shows a perspective view of an example packaged electronic device 1511 (e.g., an integrated circuit or IC) produced by the method 200 of FIG. 2 using the starting lead frame 100 of FIG. 1. The electronic device 1511 includes the molded package structure 501 with a first side 1701, an opposite second side 1702 spaced apart from the first side 1701 along the first direction (X), as well as the first end 1502 and the second end 1503 spaced apart from the first end 1502 along the second direction (Y). The electronic device 1511 also includes a top 1706 and a bottom 1708 spaced apart from the top 1706 along the third direction (Z). The electronic device 1511 in this example includes the semiconductor die 301 (e.g., FIG. 4 above) enclosed by the molded package structure 501, as well as first conductive leads 119 along the first side 1701 and second conductive leads 119 along the second side 1702 of the package structure 501. The leads 119 have the pitch spacing 103 as previously discussed. In one example, one or more of the first conductive leads 119 is/are electrically coupled to the semiconductor die 301 and one or more of the second conductive leads 119 is/are electrically coupled to the semiconductor die 301 (e.g., via bond wires 401 shown in FIG. 4).

The sawing process used to separate the packaged electronic devices 1511 and 1512 creates planar first and second ends 1502 are 1503 as shown in FIG. 17. In one example, the individual first and second sides 1701 and 1702 each include a first portion 1711 that extends from the top 1706 to a mold parting line 1704 at a non-zero first angle $\theta 1$ to the Y-Z plane of the second and third directions. In addition, the individual first and second sides 1701 and 1702 include a second portion 1712 that extends from the bottom 1708 to the mold parting line 1704 at a second non-zero angle $\theta 2$ to the Y-Z plane. In one example, the first and second angles are equal (e.g., $\theta 1=\theta 2$), although not a strict requirement of all possible implementations.

The stretch structures 116 and associated spring bars 117 at the second ends 112 of the first columns 101 in FIG. 1 provide a single yield point design that is good for manufacturability. FIGS. 1 and 10 show the spring bars 117 before punch actuation, and FIG. 14 shows the stretched spring bars 117 moved 0.409 inches in response to punch actuation to a punch depth PD (FIG. 13) of 0.032 inches. In certain examples, the spring bar 117 has a single arcuate portion. In other examples, the spring bar 117 has multiple arcuate portions. Different implementations have one or more yield locations for the individual spring bars 117.

FIGS. 18-35 show different example implementations of the spring bars and stretch structures proximately the second ends 112 of the first columns 101. These examples include the lead portions 119 and 129, the alignment holes 106, the molded package structures 501 and 502, and lower clamps 1202 as previously described.

Figure 18:
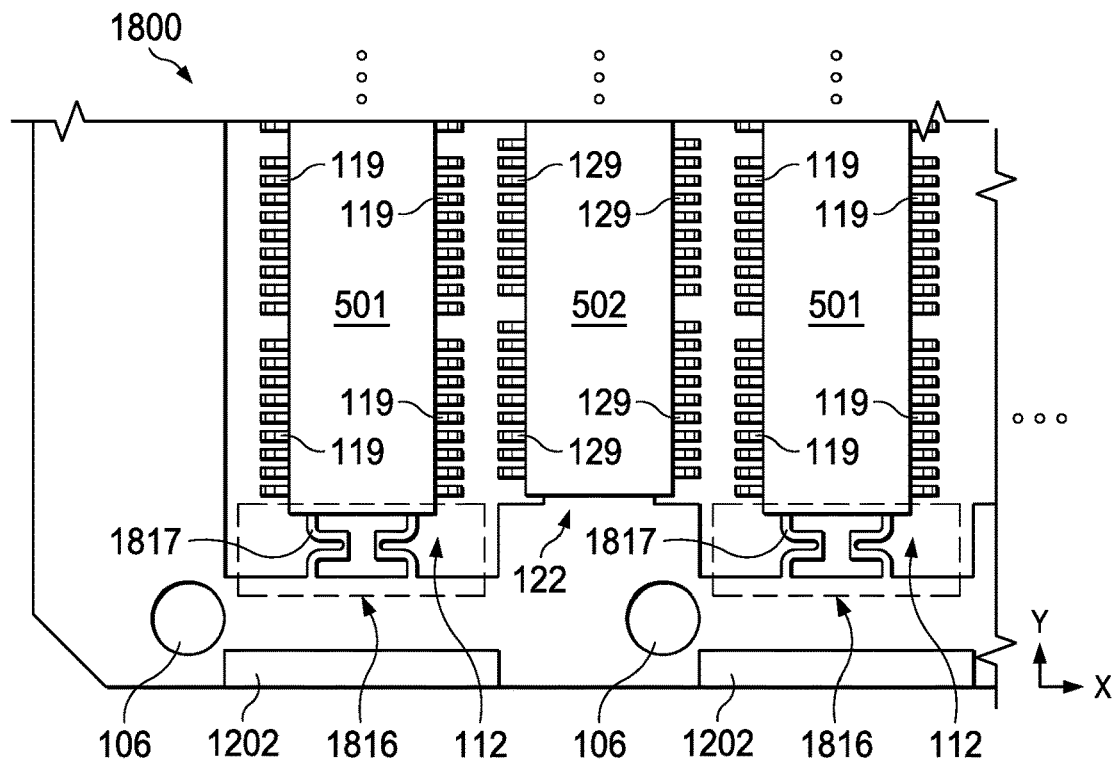
FIGS. 18 and 19 are partial top views of a lead frame with interdigitated columns and another embodiment of stretch structures at the bottom ends of the odd-numbered columns.
Figure 19:
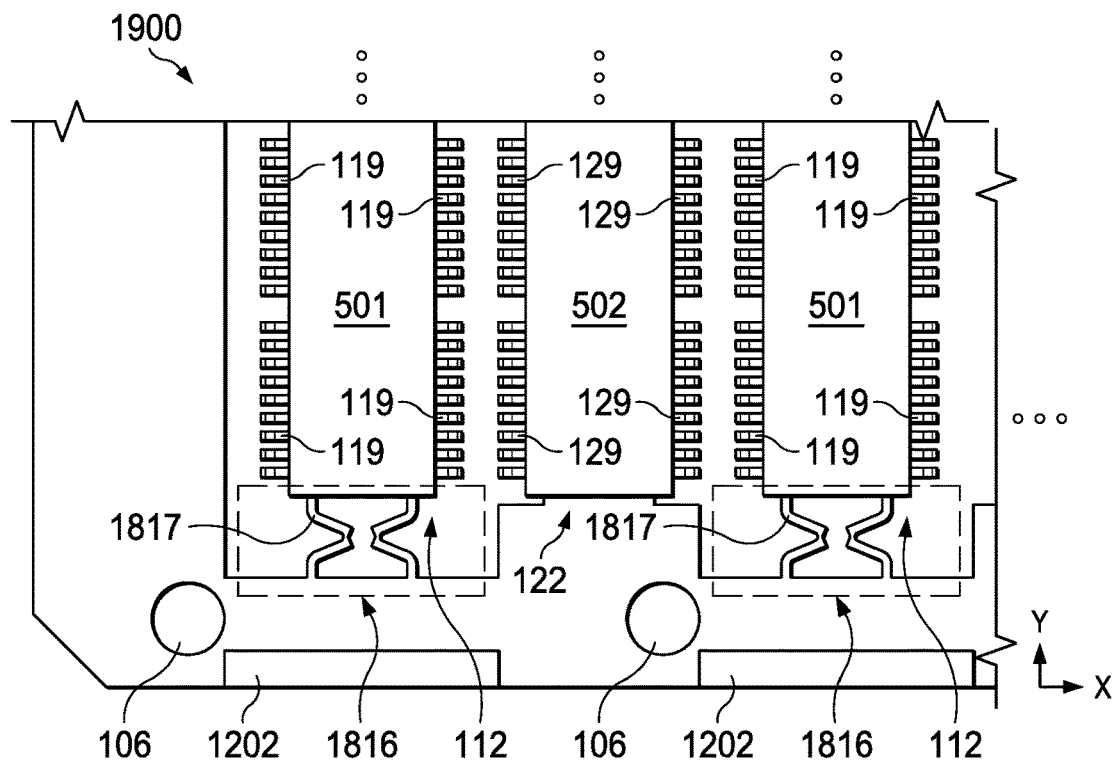

FIGS. 18 and 19 show partial top views of a lead frame 1800 with interdigitated columns as previously described. FIGS. 18 and 19 show another embodiment of stretch structures 1816 and associated spring bars 1817 at the second ends 112 of the odd-numbered columns. FIG. 18 shows the lead frame 1800 in interdigitated form prior to stretching, and FIG. 19 shows the lead frame 1800 after the first columns have been moved upward along the second (e.g., Y) direction. In this example, the punch depth PD of 0.025 inches and a second direction movement of 0.397 inches.

Figure 20:
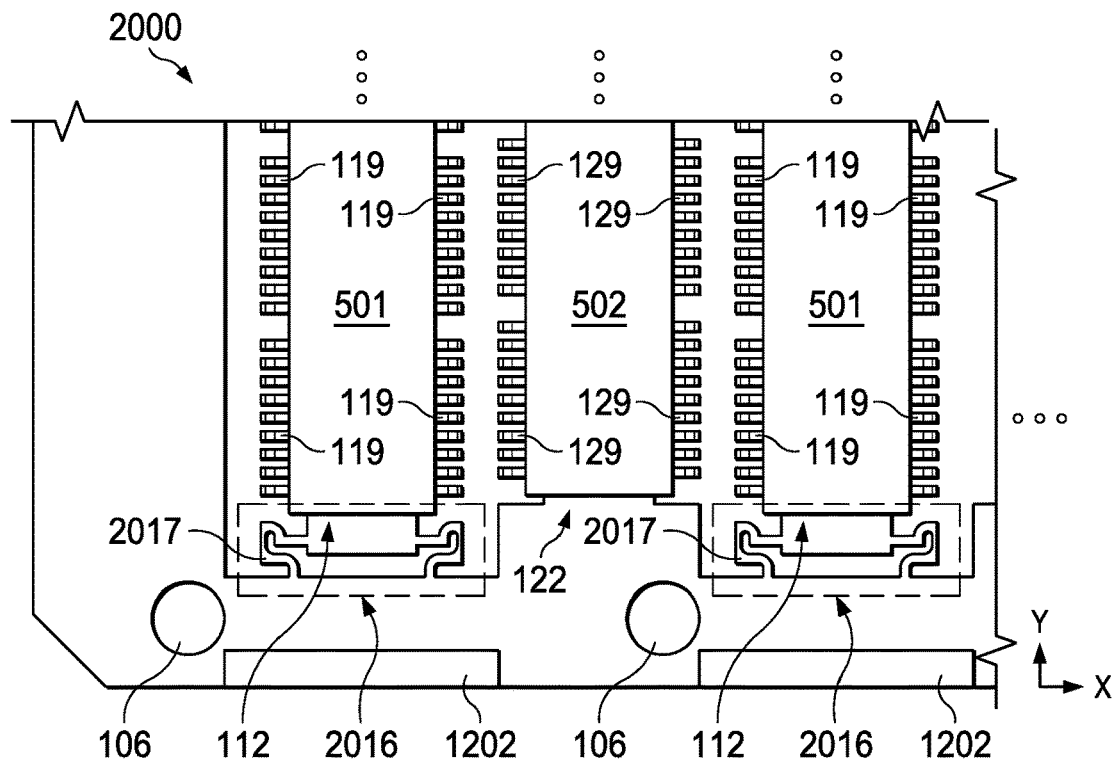
FIGS. 20 and 21 are partial top views of a lead frame with interdigitated columns and another embodiment of stretch structures at the bottom ends of the odd-numbered columns.
Figure 21:
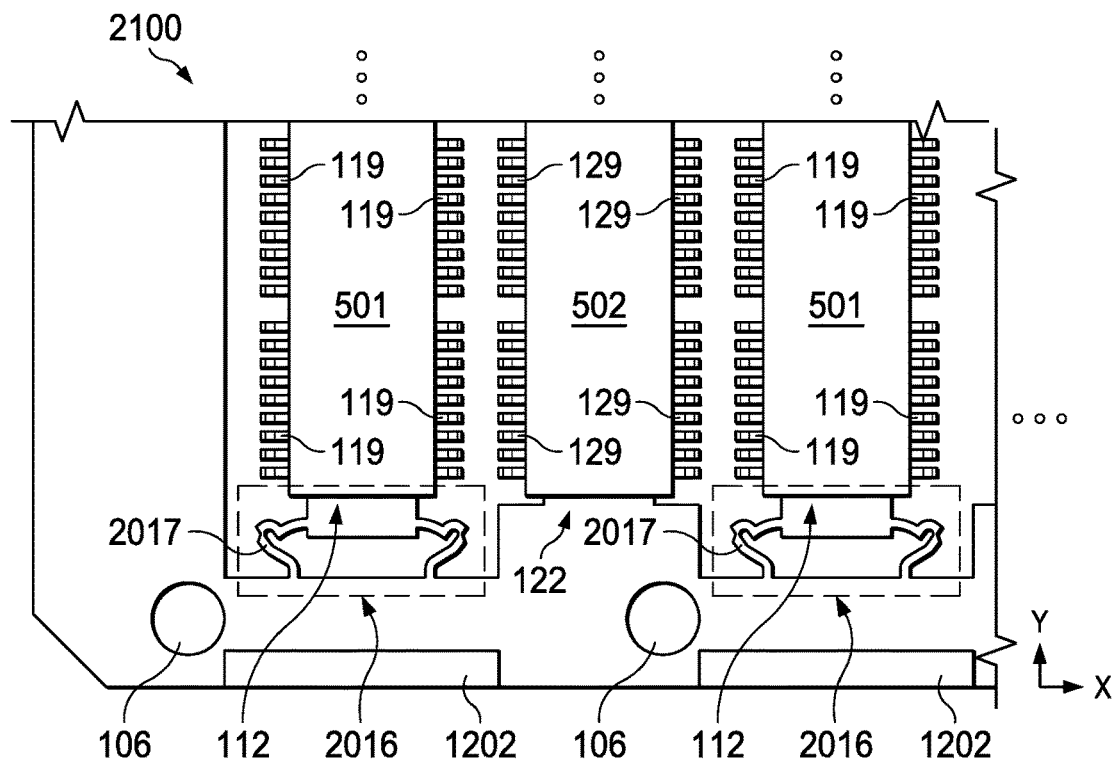

FIGS. 20 and 21 show partial top views of a lead frame 2000 with interdigitated columns as previously described. FIGS. 20 and 21 show another embodiment of stretch structures 2016 and associated spring bars 2017 at the second ends 112 of the odd-numbered columns. FIG. 20 shows the lead frame 2000 in interdigitated form prior to stretching, and FIG. 21 shows the lead frame 2000 after the first columns have been moved upward along the second (e.g., Y) direction. In this example, the punch depth PD of 0.022 inches and a second direction movement of 0.431 inches.

Figure 22:
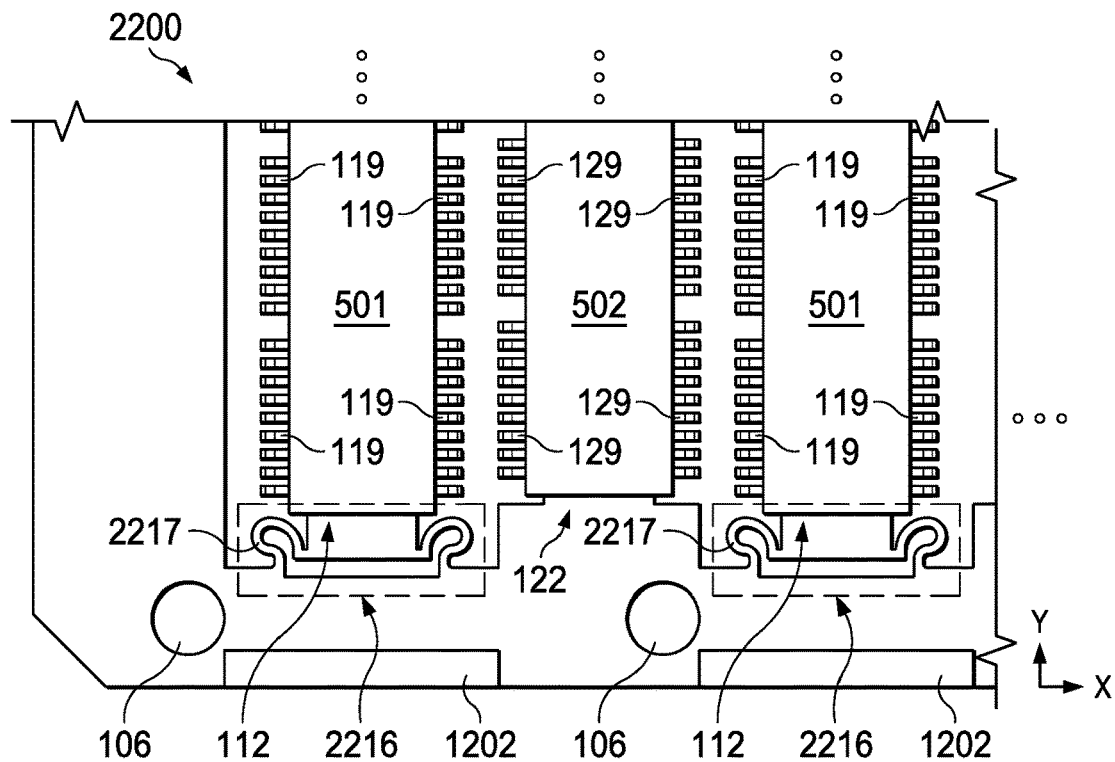
FIGS. 22 and 23 are partial top views of a lead frame with interdigitated columns and another embodiment of stretch structures at the bottom ends of the odd-numbered columns.
Figure 23:
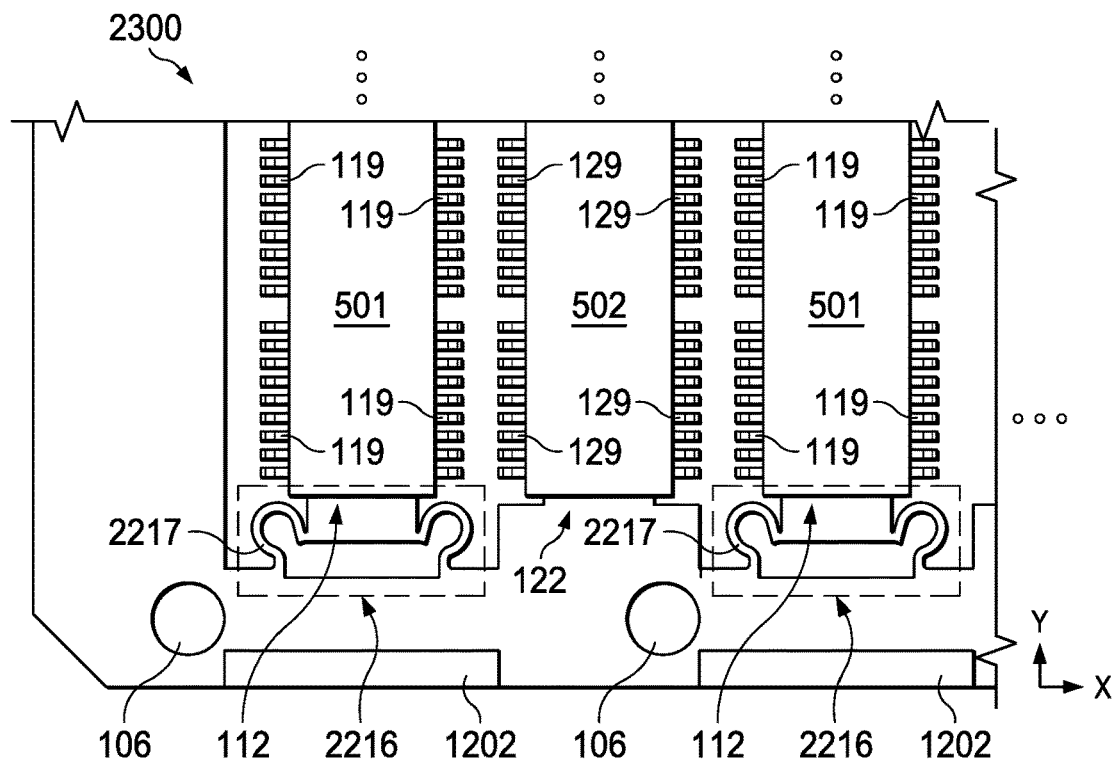

FIGS. 22 and 23 show partial top views of a lead frame 2200 with interdigitated columns as previously described. FIGS. 22 and 23 show another embodiment of stretch structures 2216 and associated spring bars 2217 at the second ends 112 of the odd-numbered columns. FIG. 22 shows the lead frame 2200 prior to stretching, and FIG. 23 shows the lead frame 2200 after the first columns have been moved upward along the second direction, with a punch depth PD of 0.020 inches and a second direction movement of 0.412 inches.

Figure 24:
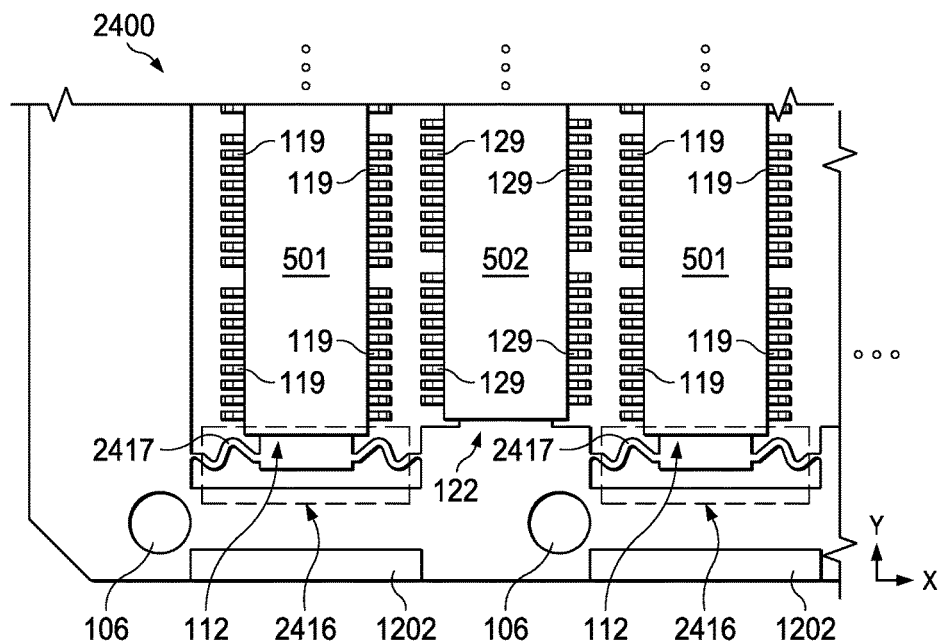
FIGS. 24 and 25 are partial top views of a lead frame with interdigitated columns and another embodiment of stretch structures at the bottom ends of the odd-numbered columns.
Figure 25:
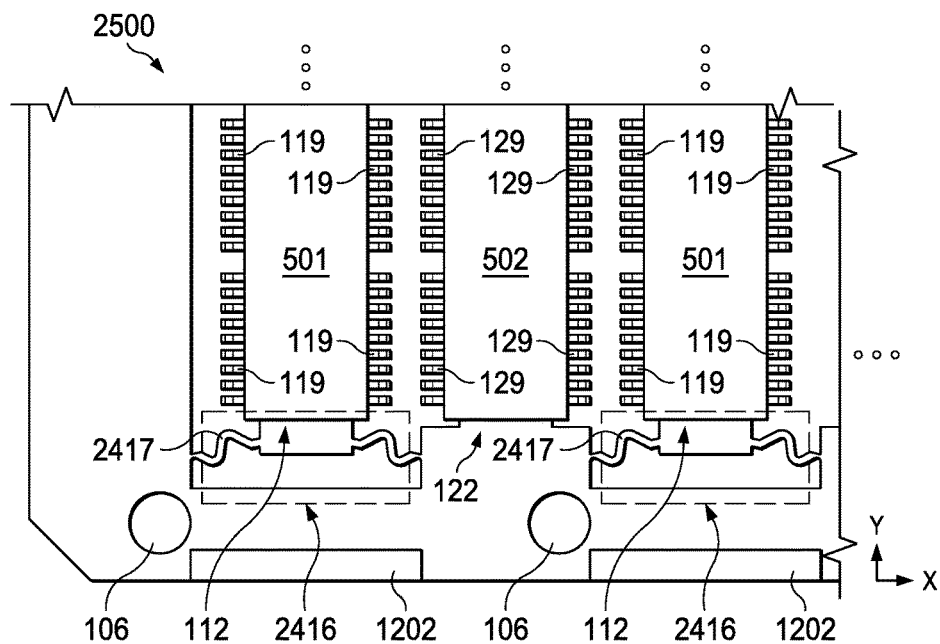

FIGS. 24 and 25 show partial top views of a lead frame 2400 with interdigitated columns as previously described. FIGS. 24 and 25 show another embodiment of stretch structures 2416 and associated spring bars 2417 at the second ends 112 of the odd-numbered columns. FIG. 24 shows the lead frame 2400 prior to stretching, and FIG. 25 shows the lead frame 2400 after the first columns have been moved upward with a punch depth PD of 0.020 inches and a second direction movement of 0.047 inches.

Figure 26:
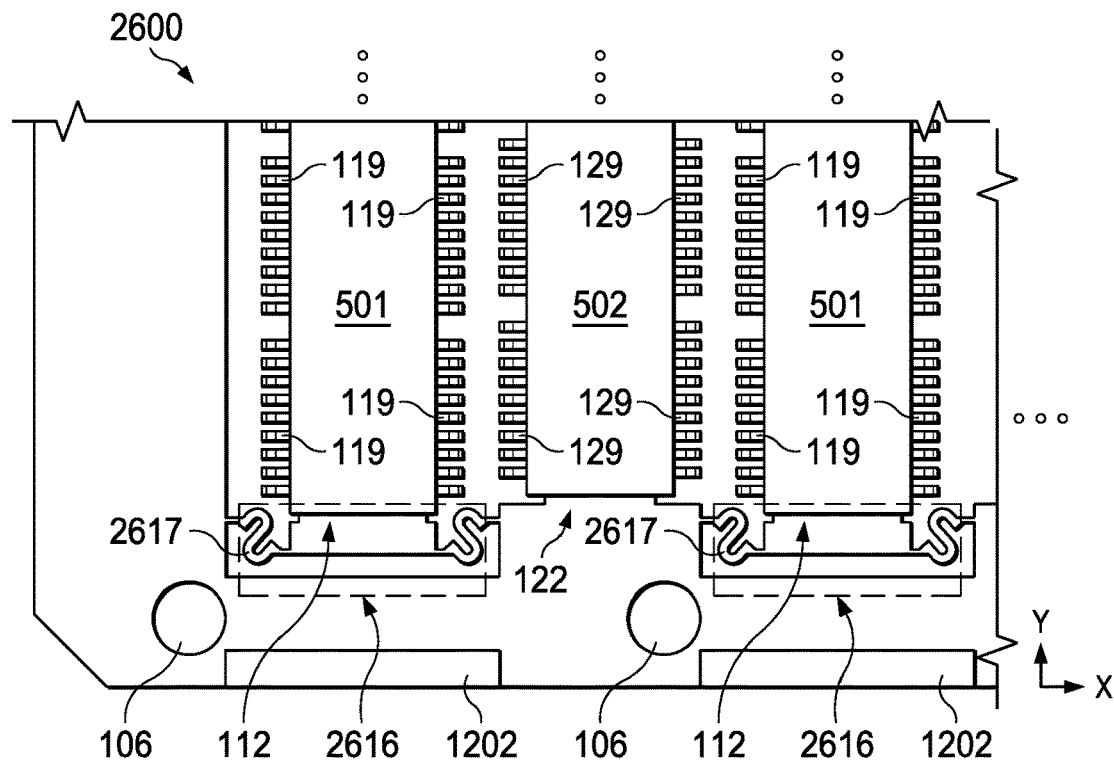
FIGS. 26 and 27 are partial top views of a lead frame with interdigitated columns and another embodiment of stretch structures at the bottom ends of the odd-numbered columns.
Figure 27:
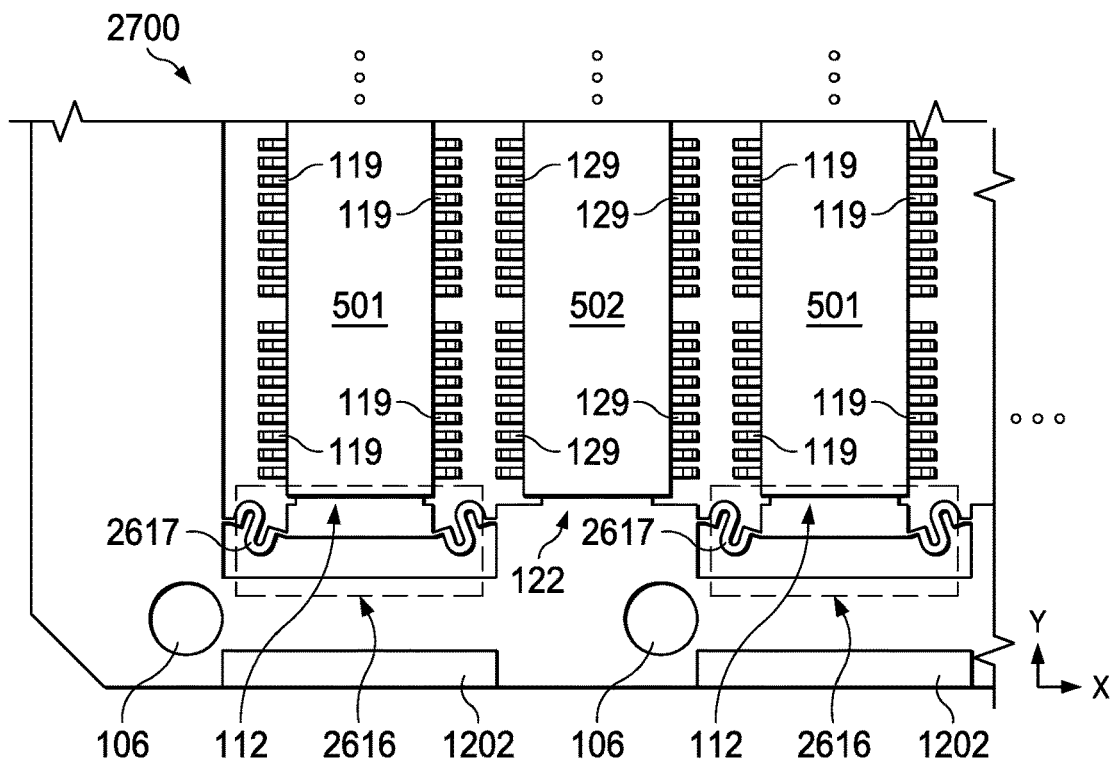

FIGS. 26 and 27 show partial top views of a lead frame 2600 with interdigitated columns as previously described. FIGS. 26 and 27 show another embodiment of stretch structures 2616 and associated spring bars 2617 at the second ends 112 of the odd-numbered columns. FIG. 26 shows the lead frame 2600 prior to stretching, and FIG. 27 shows the lead frame 2600 after the first columns have been moved upward with a punch depth PD of 0.118 inches and a second direction movement of 0.046 inches.

Figure 28:
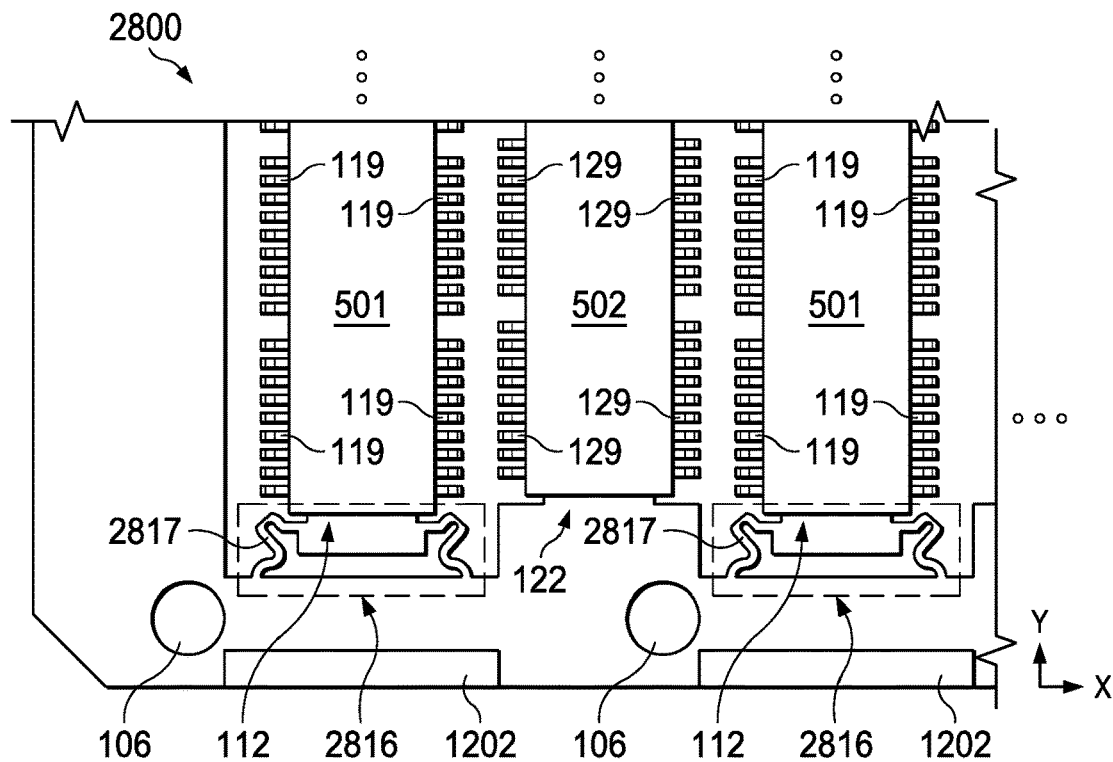
FIGS. 28 and 29 are partial top views of a lead frame with interdigitated columns and another embodiment of stretch structures at the bottom ends of the odd-numbered columns.
Figure 29:
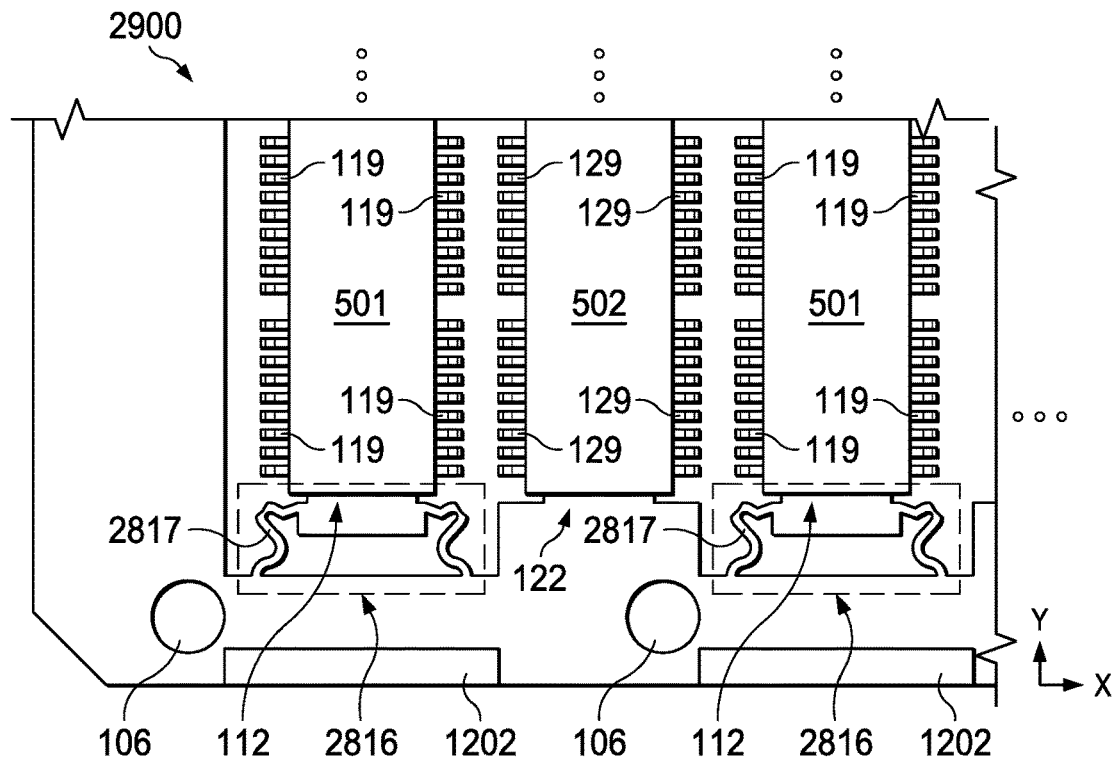

FIGS. 28 and 29 show partial top views of a lead frame 2800 with interdigitated columns as previously described. FIGS. 28 and 29 show another embodiment of stretch structures 2816 and associated spring bars 2817 at the second ends 112 of the odd-numbered columns. FIG. 28 shows the lead frame 2800 prior to stretching, and FIG. 29 shows the lead frame 2800 after the first columns have been moved upward with a punch depth PD of 0.023 inches and a second direction movement of 0.400 inches.

Figure 30:
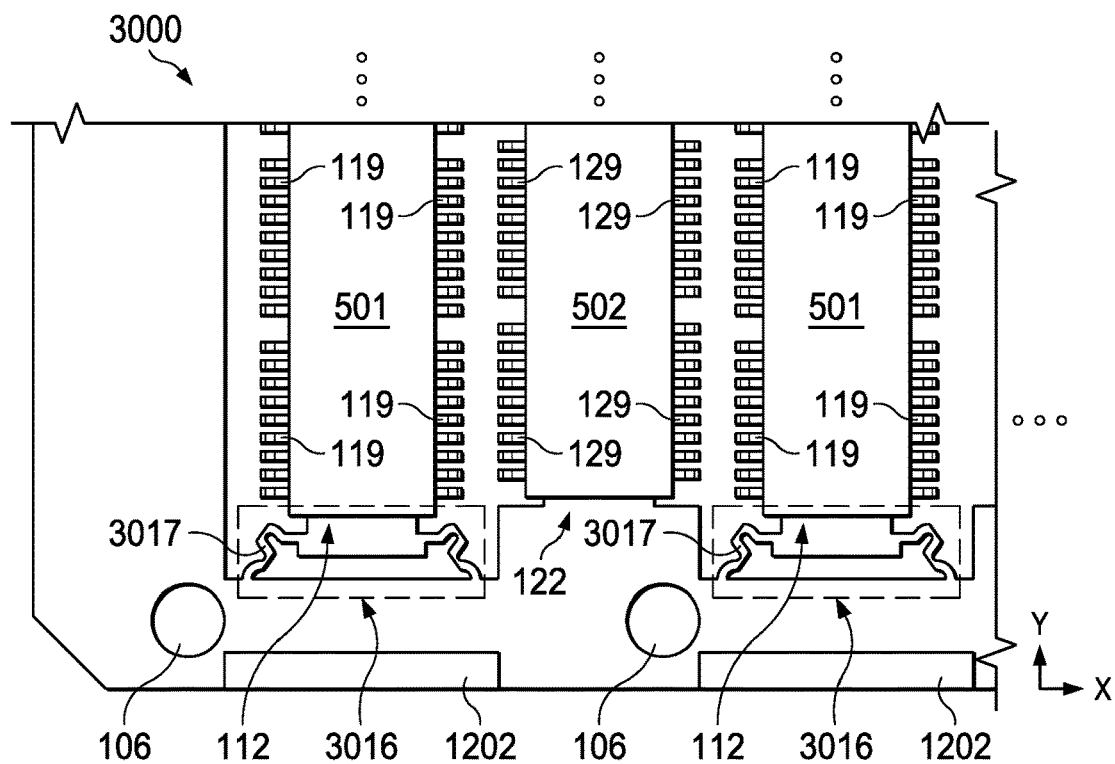
FIGS. 30 and 31 are partial top views of a lead frame with interdigitated columns and another embodiment of stretch structures at the bottom ends of the odd-numbered columns.
Figure 31:
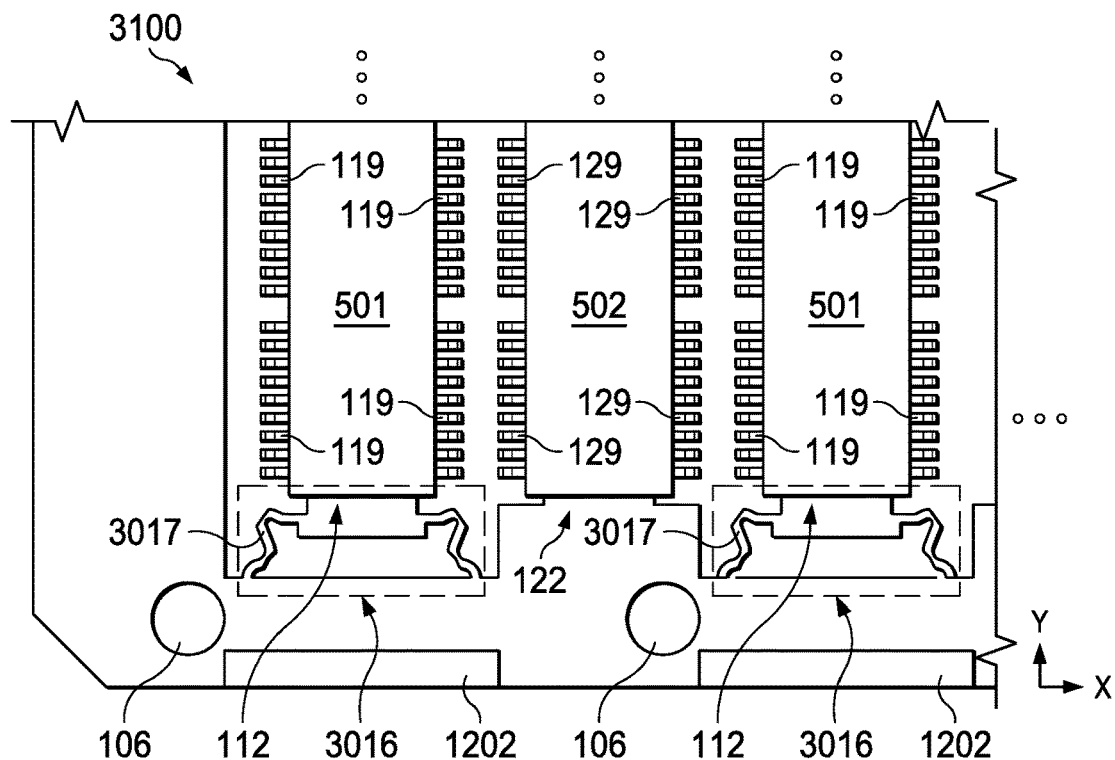

FIGS. 30 and 31 show partial top views of a lead frame 3000 with interdigitated columns as previously described. FIGS. 30 and 31 show another embodiment of stretch structures 3016 and associated spring bars 3017 at the second ends 112 of the odd-numbered columns. FIG. 30 shows the lead frame 3000 prior to stretching, and FIG. 31 shows the lead frame 3000 after the first columns have been moved upward with a punch depth PD of 0.023 inches and a second direction movement of 0.454 inches.

Figure 32:
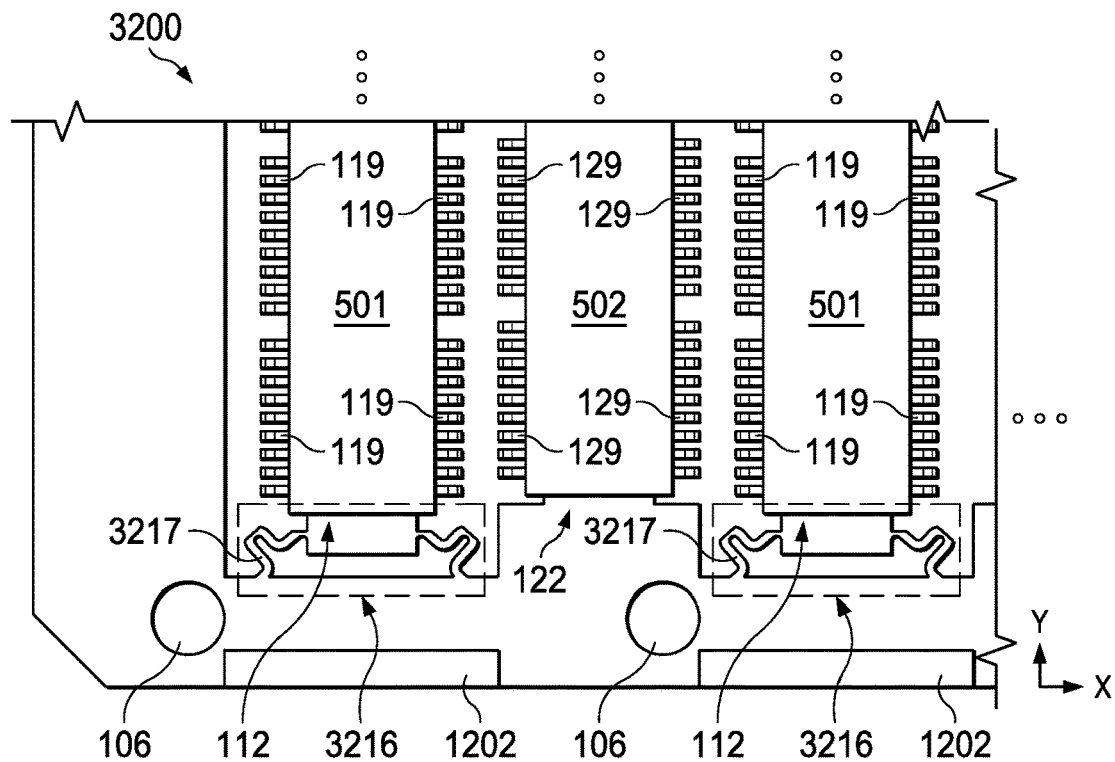
FIGS. 32 and 33 are partial top views of a lead frame with interdigitated columns and another embodiment of stretch structures at the bottom ends of the odd-numbered columns.
Figure 33:
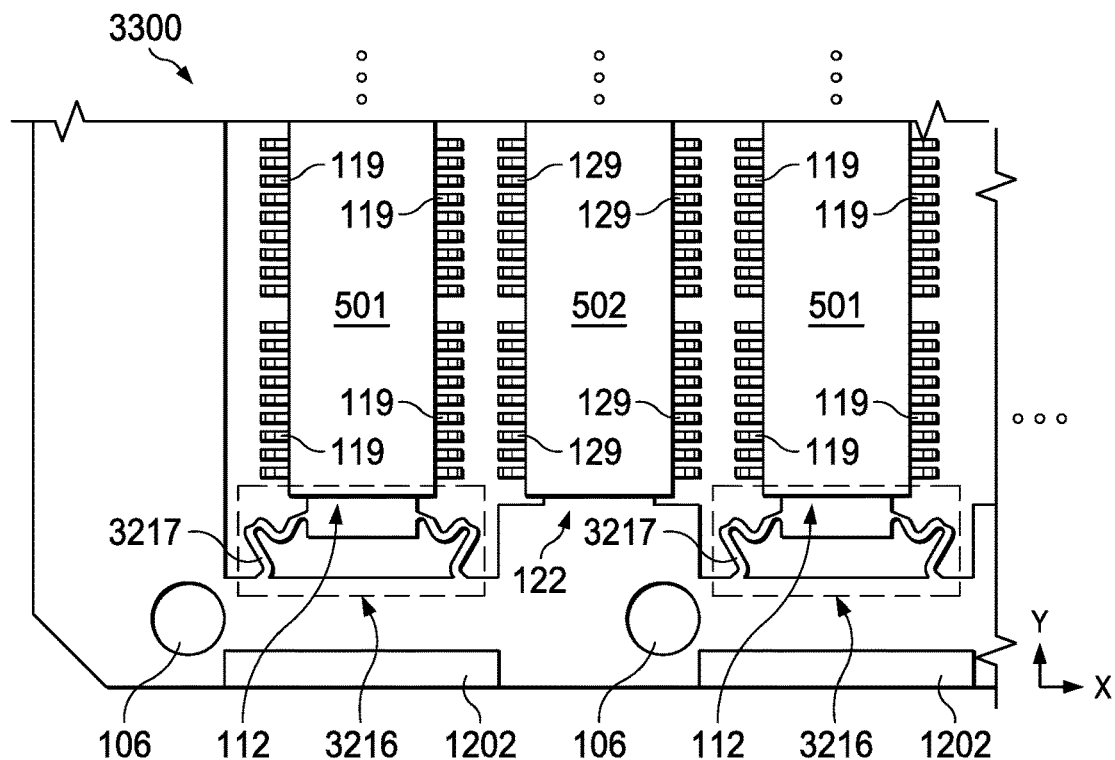

FIGS. 32 and 33 show partial top views of a lead frame 3200 with interdigitated columns as previously described. FIGS. 32 and 33 show another embodiment of stretch structures 3216 and associated spring bars 3217 at the second ends 112 of the odd-numbered columns. FIG. 32 shows the lead frame 3200 prior to stretching, and FIG. 33 shows the lead frame 3200 after the first columns have been moved upward with a punch depth PD of 0.042 inches and a second direction movement of 0.011 inches.

Figure 34:
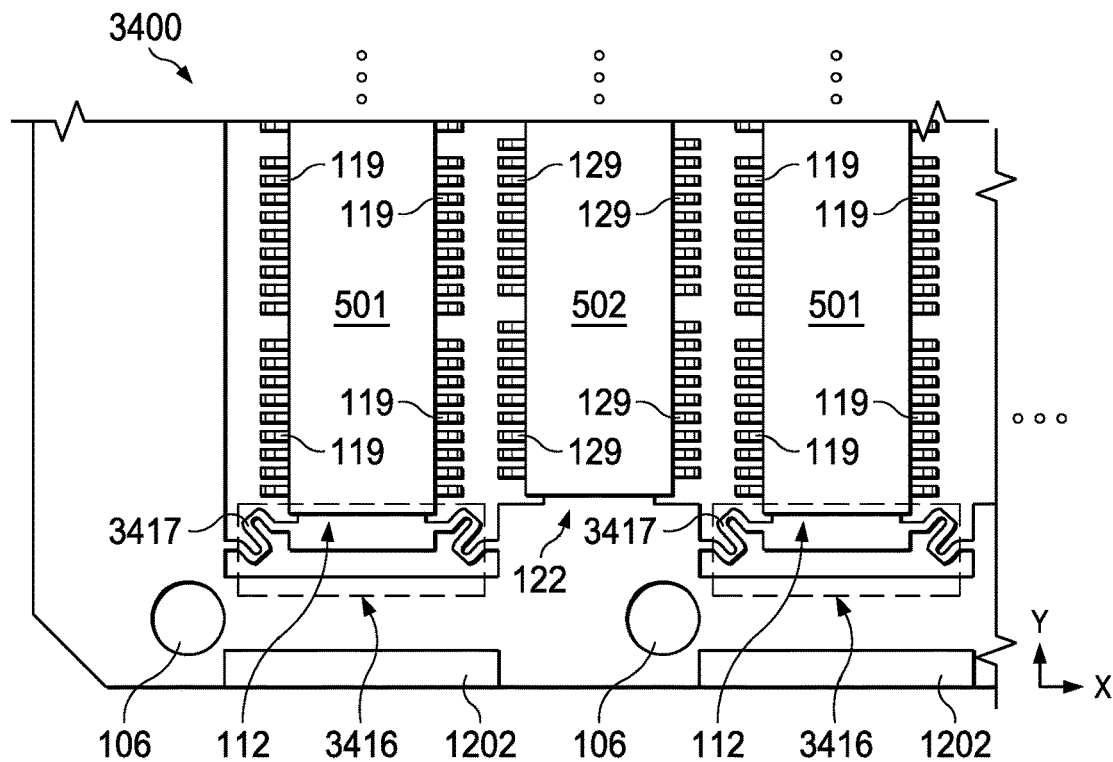
FIGS. 34 and 35 are partial top views of a lead frame with interdigitated columns and another embodiment of stretch structures at the bottom ends of the odd-numbered columns.
Figure 35:
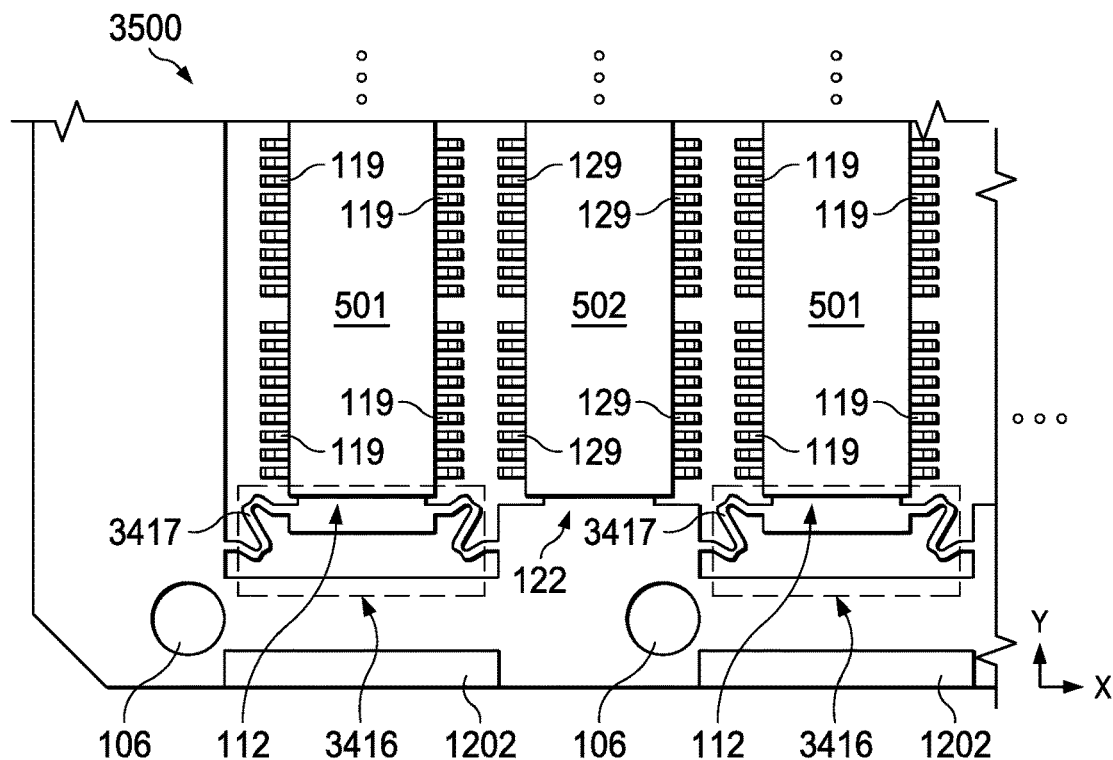

FIGS. 34 and 35 show partial top views of a lead frame 3400 with interdigitated columns as previously described. FIGS. 34 and 35 show another embodiment of stretch structures 3416 and associated spring bars 3417 at the second ends 112 of the odd-numbered columns. FIG. 34 shows the lead frame 3400 prior to stretching, and FIG. 35 shows the lead frame 3500 after the first columns have been moved upward with a punch depth PD of 0.036 inches and a second direction movement of 0.421 inches.

The designs of FIGS. 1, 22-23, 32-33 and 28-29 give comparable pitch correction result with the spring bars 1817 of FIGS. 18 and 19. The designs of FIGS. 20-21, 24-25, 26-27, 30-31 and 34-35 give higher value of pitch correction along the second direction.

The above examples are merely illustrative of several possible implementations of various aspects of the present disclosure, wherein equivalent alterations and/or modifications will occur to others skilled in the art upon reading and understanding this specification and the annexed drawings. Modifications are possible in the described examples, and other implementations are possible, within the scope of the claims.

What is claimed is:
1. A lead frame, comprising:
 a metal structure having prospective device portions arranged in rows that extend along a first direction and columns that extend along a second direction, the first direction being perpendicular to the second direction, the columns including:
  first columns having:
   respective first ends,
   second ends spaced apart from the respective first ends along the second direction, and
   first device portions that include a respective first die attach pad, and respective first lead portions; and
  second columns having second device portions that include a respective second die attach pad and respective second lead portions;
 at least some of the first columns being adjacent to one of the second columns;

punch structures, including a punch bar extending along the second direction from the first end of a respective first column to a first clamp portion of the metal structure, the punch bar deformable along a third direction normal to a plane of the first and second directions; and stretch structures, including a spring bar extending along an arcuate path from the second end of a respective first column to a second clamp portion of the metal structure, the spring bar configured to extend along the second direction to allow movement of the respective first column along the second direction toward the first clamp portion of the metal structure.

2. The lead frame of claim 1, wherein at least some of the first lead portions of a given one of the first columns are connected to a respective one of the second lead portions of a second device portion of an adjacent one of the second columns.

3. The lead frame of claim 2, wherein the spring bar is configured to extend along the second direction toward the first clamp portion by a pitch spacing distance of the first lead portions in response to deformation of the punch bar by a punch depth dimension.

4. The lead frame of claim 1, wherein the spring bar is configured to extend along the second direction toward the first clamp portion by a pitch spacing distance of the first lead portions in response to deformation of the punch bar by a punch depth dimension.

5. The lead frame of claim 1, wherein the first columns and the second columns are alternating.

6. The lead frame of claim 1, wherein:
the respective punch structures include a second punch bar extending along the second direction from the first end of the respective first column to the first clamp portion of the metal structure; and
the respective stretch structures include a second spring bar extending along a second arcuate path from the second end of the respective first column to the second clamp portion of the metal structure.

7. The lead frame of claim 6, wherein the respective spring bar and the second spring bar include first and second arcuate portions.

8. The lead frame of claim 1, wherein the spring bar includes first and second arcuate portions.

9. A method, comprising:
performing a die attach process that: attaches first semiconductor dies to respective first die attach pads of first device portions of respective first columns of a lead frame; and attaches second semiconductor dies to respective second die attach pads of second device portions of respective second columns of the lead frame, the lead frame including rows that extend along a first direction and the first and second columns extend along a second direction, the first direction being perpendicular to the second direction;
performing a molding process that: encloses the first semiconductor dies of each respective first columns in a single respective first package structure; and encloses the second semiconductor dies of each respective second column in a single respective second package structure;
performing a lead trimming process that cuts through the lead frame along trim lines to separate respective first and second lead portions of adjacent ones of the first and second columns of the lead frame, the trim lines being parallel to the second direction;
moving the first columns along the second direction relative to the second columns; and
performing a cutting process that cuts through the lead frame and the first and second package structures along cut lines between the first device portions of the respective first columns and between the second device portions of the respective second columns, the cut lines being parallel to the first direction.

10. The method of claim 9, wherein moving the first columns along the second direction relative to the second columns comprises:
deforming punch bars proximate first ends of the respective first columns along a third direction normal to a plane of the first and second directions to extend spring bars proximate second ends of the respective first columns along the second direction.

11. The method of claim 9, wherein moving the first columns along the second direction relative to the second columns comprises moving the first columns by a pitch spacing distance of the first lead portions relative to the second columns.

12. The method of claim 9, further comprising, before performing the molding process:
performing an electrical connection process that: electrically couples at least one of the first lead portions to a conductive feature of the respective first semiconductor die of the respective first device portions of the respective first columns; and electrically couples at least one of the second lead portions to a conductive feature of the respective second semiconductor die of the respective second device portions of the respective second columns.

13. A method, comprising:
performing a die attach process that: attaches first semiconductor dies to respective first die attach pads of first device portions of respective first columns of a lead frame; and attaches second semiconductor dies to respective second die attach pads of second device portions of respective second columns of the lead frame;
performing a molding process that: encloses the first semiconductor dies of each respective first columns in a single respective first package structure; and encloses the second semiconductor dies of each respective second column in a single respective second package structure;
performing a lead trimming process that cuts through the lead frame along trim lines to separate respective first and second lead portions of adjacent ones of the first and second columns of the lead frame, the trim lines being parallel to the second direction;
moving the first columns along the second direction relative to the second columns; and
separating individual packaged electronic devices of the respective first and second columns from one another.

14. The method of claim 13, wherein moving the first columns along the second direction relative to the second columns comprises:
deforming punch bars proximate first ends of the respective first columns along a third direction normal to a plane of the first and second directions to extend spring bars proximate second ends of the respective first columns along the second direction.

15. The method of claim 13, wherein moving the first columns along the second direction relative to the second columns comprises moving the first columns by a pitch spacing distance of the first lead portions relative to the second columns.

16. The method of claim 13, further comprising, before performing the molding process:
performing an electrical connection process that: electrically couples at least one of the first lead portions to a conductive feature of the respective first semiconductor die of the respective first device portions of the respective first columns; and electrically couples at least one of the second lead portions to a conductive feature of the respective second semiconductor die of the respective second device portions of the respective second columns.

* * * * *